(12) United States Patent
Levinson et al.

(10) Patent No.: US 11,415,897 B2
(45) Date of Patent: Aug. 16, 2022

(54) CALIBRATING STOCHASTIC SIGNALS IN COMPACT MODELING

(71) Applicant: Synopsys, Inc., Mountain View, CA (US)

(72) Inventors: Zachary Adam Levinson, Austin, TX (US); Yudhishthir Prasad Kandel, Durham, NC (US); Ulrich Welling, Munich (DE)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/339,179

(22) Filed: Jun. 4, 2021

(65) Prior Publication Data

US 2021/0382394 A1 Dec. 9, 2021

Related U.S. Application Data

(60) Provisional application No. 63/035,468, filed on Jun. 5, 2020.

(51) Int. Cl.
*G03F 7/20* (2006.01)

(52) U.S. Cl.
CPC ............ *G03F 7/705* (2013.01); *G03F 7/7085* (2013.01); *G03F 7/70625* (2013.01); *G03F 7/70633* (2013.01)

(58) Field of Classification Search
CPC .. G03F 7/705; G03F 7/70625; G03F 7/70633; G03F 7/7085; G03F 7/70483–70541; G03F 7/70608–70683; G03F 7/0037; G03F 7/20; G03F 7/70425–70441; G03F 7/70125; G03F 7/70283; G03F 7/70091; G03F 7/70466;
(Continued)

(56) References Cited

U.S. PATENT DOCUMENTS 9,679,116 B2 * 6/2017 Biafore ................. G03F 7/0045
2019/0272623 A1 * 9/2019 Mack ..................... G06F 17/18
(Continued)

OTHER PUBLICATIONS

Levinson et al., "Compact modeling to predict and correct stochastic hotspots in EUVL," published 2020, Proceedings of SPIE. (Year: 2020).*
(Continued)

*Primary Examiner* — Christina A Riddle
(74) *Attorney, Agent, or Firm* — Patterson + Sheridan, LLP

(57) ABSTRACT

Calibrating stochastic signals in compact modeling is provided by obtaining data of process variations in producing a resist mask; calibrating a continuous compact model of the resist mask based on the data; evaluating the continuous compact model against a stochastic compact model that is based on the data; choosing a functional description of an edge location distribution for the stochastic compact model; mapping image parameters from the evaluation to edge distribution parameters according to the functional description; determining an edge location range for the stochastic compact model based on scaled measurements from the image parameters; calibrating a threshold for the resist mask and updating parameters of the stochastic compact model to reduce a difference between the data and a modeled Line Edge Roughness (LER) value; and outputting the stochastic compact model.

20 Claims, 14 Drawing Sheets

(58) Field of Classification Search
CPC . G03F 1/36; G06F 30/00; G06F 30/17; G06F 30/18; G06F 30/398; G06F 30/20; G06F 30/23; G06F 30/39; G06F 30/367; G06F 30/373; G06F 30/30; G06F 30/327; G06F 30/33; G06F 30/3312; G06F 30/34; G06F 30/36; G06F 30/392; G06F 30/394; G06F 2111/08; G06F 2111/10; G06F 2119/18; G06F 2119/22
USPC ...... 355/30, 52–55, 67–77, 133; 716/50–56; 430/5, 22, 30
See application file for complete search history.

(56) References Cited

U.S. PATENT DOCUMENTS

2019/0317410 A1* 10/2019 Hansen ............... G03F 7/70608
2021/0088913 A1*  3/2021 Melvin, III ......... G03F 7/70283
2021/0382393 A1* 12/2021 Hansen ................ G06F 30/398

OTHER PUBLICATIONS

De Bisschop, "Stochastic printing failures in extreme ultraviolet lithography," published 2018, Journal of Micro/Nanolithography, MEMS, and MOEMS. (Year: 2018).*

Maslow, et al, "Impact of Local Variability on Defect-Aware Process Windows" Extreme Ultraviolet (EUV) Lithography X, edited by Kenneth A. Goldberg, Proc. of SPIE vol. 10957, Proc. of SPIE vol. 10957 109570H-1, Downloaded From: https://www.spiedigitallibrary.org/conference-proceedings-of-spie on Jan. 21, 2020.

* cited by examiner

CALIBRATING STOCHASTIC SIGNALS IN COMPACT MODELING

CROSS-REFERENCES TO RELATED APPLICATIONS

The present disclosure claims priority to U.S. Provisional Application No. 63/035,468 filed Jun. 5, 2020, which is hereby expressly incorporated by reference herein in its entirety as if fully set forth below and for all applicable purposes.

TECHNICAL FIELD

The present disclosure relates to calibrating stochastic signals in compact modeling in microlithographic processes.

BACKGROUND

Microlithography is a manufacturing process which involves making a relief image of a master pattern (called the mask, or reticle) in a photosensitive material (called photoresist, or resist). The goal of any lithographic process is to transfer the pattern on the reticle into a photoresist film with good fidelity. The quality of the resulting pattern is dependent on the uniformity of photon absorption events that a photoresist pattern receives during exposure and the uniformity of the subsequent photo-chemical reactions in the photoresist. Photon statistics (e.g., shot noise) become increasingly important as the source photon count output decreases because the number of photon absorption events is the first in a chain of stochastic processes in a lithographic process.

When using a deep ultraviolet excimer laser source with a high photon output, the effects of photon shot noise can be largely ignored. Extra attention could be paid to select patterns which are prone to stochastic failure during mask correction, optimization, and verification. The term "stochastic failure" is used herein to describe any nonconformance that has a statistically or probabilistically measurable chance of occurrence, but cannot be predicted exactly. However, next-generation extreme ultraviolet lithography (EUVL) systems struggle from both low photon output and low source throughput through the tool. For these reasons, photon shot noise plays a much larger role in image process development for EUVL than in older technology processes.

Currently, two distinct approaches are taken to manage the Local Edge Placement Uniformity (LEPU) error or Local Critical Dimension Uniformity (LCDU) error associated with photon shot noise. The classical approach is to assume a constant Line Edge Roughness (LER) around the nominal gauge, often measured directly on a wafer, and use this information as a part of various optimization steps in creating the feature. Alternatively to using a constant LER, a fabricator can assume LER to be proportional to some quantity that is measured or computed. Normalized Image Log Slope (NILS) for repeated features (e.g., lines and spaces, contact holes, repeated cut lines, etc.) is used as such a measure to identify the problem areas. The use of lithography to print smaller two-dimensional feature means that there is no established method for computing the edge placement error and to design or optimize features to compensate for these stochastic variations.

BRIEF DESCRIPTION OF THE DRAWINGS

The disclosure will be understood more fully from the detailed description given below and from the accompanying figures of examples described herein. The figures are used to provide knowledge and understanding of examples described herein and do not limit the scope of the disclosure to these specific examples. Furthermore, the figures are not necessarily drawn to scale.

SUMMARY

Figure 1:
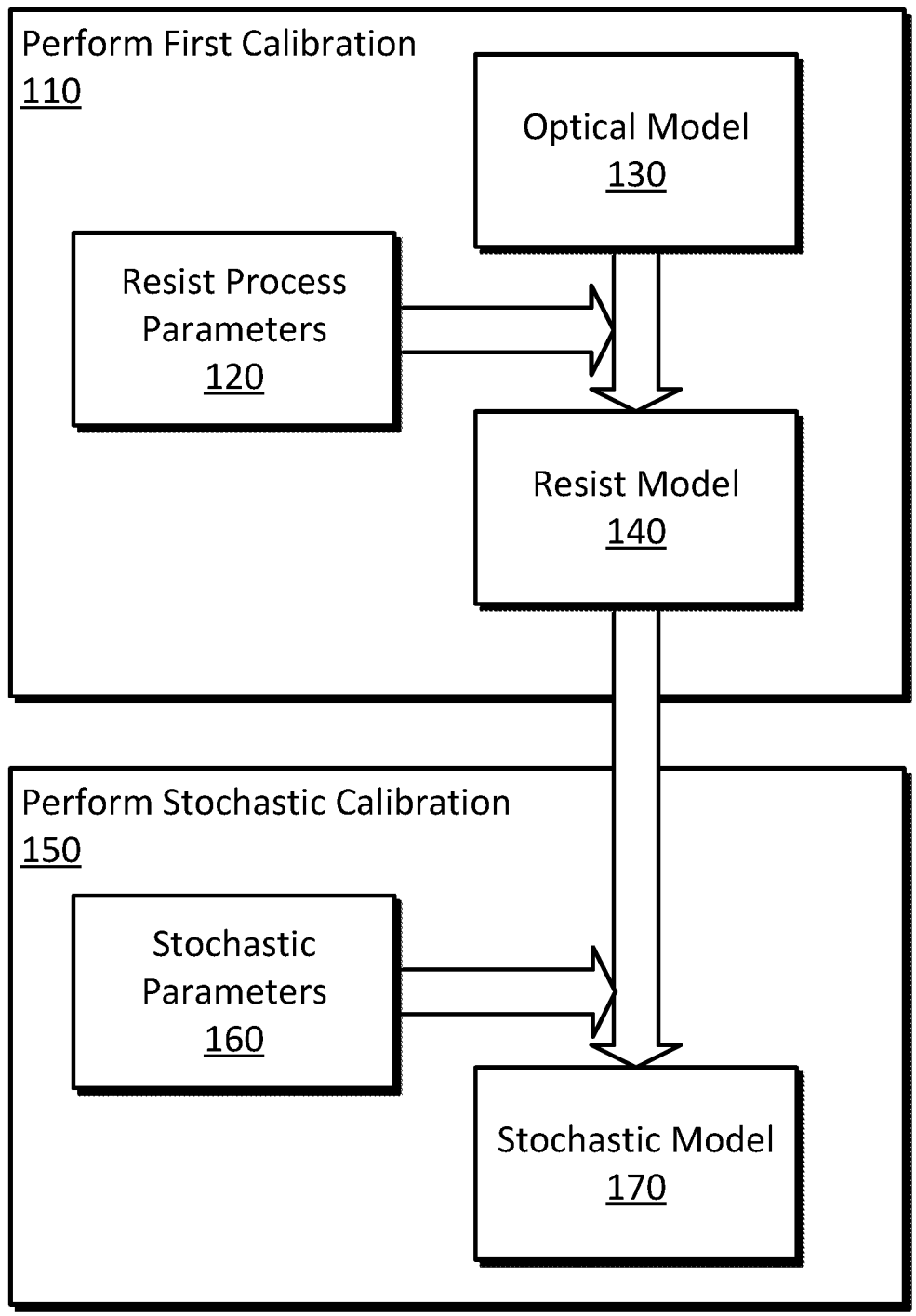
FIG. 1 depicts a general compact model flow for stochastic model following the optical and resist model, according to embodiments of the present disclosure.

In one aspect, the present disclosure provides a method comprising: obtaining data of process variations in producing a resist mask; calibrating a continuous compact model of the resist mask based on the data; evaluating the continuous compact model against a stochastic compact model that is based on the data; choosing a functional description of an edge location distribution for the stochastic compact model; mapping image parameters from the evaluation to edge distribution parameters according to the functional description; determining an edge location range for the stochastic compact model based on scaled measurements from the image parameters; calibrating a threshold for the resist mask and updating parameters of the stochastic compact model to reduce a difference between the data and a modeled Line Edge Roughness (LER) value; and outputting the stochastic compact model.

In one aspect, the present disclosure provides a method, comprising: generating a continuous compact model for a resist mask pattern calibrated to production data; evaluating the production data according to the continuous compact model; selecting a functional description to represent an edge location range of the resist mask pattern in a stochastic compact model of the resist mask pattern; mapping the evaluated production data to the selected functional description; and generating the stochastic compact model that probabilistically models the edge location ranges for the resist mask pattern based on the mapped production data.

In one aspect, the present disclosure provides a system, comprising: a processor; and a memory including instructions that when executed by the processor are configured to perform an operation comprising: obtaining data of process variations in producing a resist mask; calibrating a continuous compact model of the resist mask based on the data; evaluating the continuous compact model against a stochastic compact model that is based on the data; choosing a functional description of an edge location distribution for the stochastic compact model; mapping image parameters from the evaluation to edge distribution parameters according to the functional description; computing an edge location range for the stochastic compact model based on scaled measurements from the image parameters; calibrating a threshold for the resist mask and updating parameters of the stochastic compact model to reduce a difference between the data and a modeled Line Edge Roughness (LER) value; and outputting the stochastic compact model.

DETAILED DESCRIPTION

Aspects described herein relate to calibrating stochastic signals in compact modeling in microlithographic processes. At the individual molecule level, all chemical processes are stochastic in nature. When the number of molecules, ions, and photons participating in the imaging process becomes very large, the stochastic nature of the reactions can be described through a continuous process. The reduced photon counts in EUVL (Extreme Ultraviolent Lithography) processes, and the reduced number of photoresist molecules participating in the processes, increases the stochastic variation of all processes which occur after photon absorption. This increased variance causes the printed edge to move away from the mean edge with some probability. Thus, some structures may be randomly missing or otherwise unusable.

The present disclosure builds on methods that use pre-computed continuous signals and measured or rigorously simulated LEPU or LCDU values to calibrate a confidence band around the contour from a continuous signal. This process adds small overheads to existing simulation flows. Testing has shown the accuracy in predicting the three-sigma confidence interval of the flow is relatively better (e.g., four times better) compared to considering only NILS. The calibration approach can be simplified to include only the aerial image of the wafer. Methodology accuracy is improved by using the signal that includes material interaction with the aerial image. The inhibitor concentration field after exposure and post-application bake is an example of a signal that improves the accuracy.

For a process that is repeatable and carried out using the same equipment and method, as is the case with the lithography process, pure stochastic variation should be predictable for a random edge placement error distribution. It is not possible to know where exactly the edge will form, but when a large number of experiments are carried out, a confidence band of probable edge locations can be assigned. Existing contouring methods only provide a good estimate with an implied error band given by LER. The present disclosure calculates confidence bands around the placement of the corrected edge contour. The confidence bands identify a number of times that an edge location appears within a given locational range from a mean location. For example, when the edge location appears between location X and location Y with a specified confidence level of Z % of the time, the confidence band is provided from location X to location Y (relative to a nominal or mean location) to indicate where the edge location occurs Z % of the time. There is a non-zero chance (e.g., 100−Z) that the edge location will occur outside of the range specified by location X and location Y, and different values for X, Y, and Z can be set to describe different confidence bands (e.g., a range of $X_1$-$Y_1$ nanometers (nm) occurs $Z_1$% of the time, a range of $X_2$-$Y_2$ nm occurs $Z_2$% of the time where $X_1$-$Y_1 \neq X_2$-$Y_2$ and $Z_1 \neq Z_2$).

Confidence band information can be used for identifying the stochastically non-robust part of the layout or Optical Proximity Correction/Resolution Enhancement Technology/Inverse Lithography Techniques (OPC/RET/ILT/) correction. Further, OPC or Source Mask Optimization (SMO) can be carried out to improve the robustness of the pattern to improve any weak points that have been identified as prone to failure or not meeting specified tolerances. Additionally, robustness of the critical patterns can be improved to increase the yield. Confidence level for the error bands can be improved by gathering more data via a calibrated rigorous simulator or large scale gathering and analysis of the printed features using metrology tools such as Critical Dimension Scanning Electron Microscope (CD-SEM). Through the design of the appropriate loss function, one can use the information obtained to perform defect window centering, robust OPC against stochastic defect, yield estimation, etc. The information obtained can be used for understanding the LCDU variations for improvement in Inverse Lithography Technology (ILT).

FIG. 1 is a high-level view of a flow 100 for creating a stochastic model 170, in accordance with one embodiment of the present disclosure. As shown, during the first calibration at 110, the resist process parameters 120 are used with the optical model 130 to generate a resist model 140. The resist process parameters 120 can include the location of where a resist mask is placed, a thickness of the resist mask, a material composition of the resist mask, an intensity and frequently of light applied to the resist mask, a duration of how long the resist mask is allowed to sit before light exposure, a duration of light exposure, and the like. Additionally, the resist process parameters 120 can include for a Post Exposure Bake (PEB) operation, where the wafer is heated to a designated temperature for a designate time to affect dopant diffusion in the wafer after an initial light exposure operation.

During the stochastic calibration at 150, stochastic parameters 160 together with the resist model 140 are used to generate a stochastic model 170. The stochastic model 170 identifies confidence bands for the locations of the line edges from a mean value, allowing a designer to identify stochastic variation across the process.

In some embodiments, the optical model 130 and the resist model 140 determine an optical signal intensity and an optical signal threshold associated with an optical signal. In some embodiments, the stochastic model 170 inherits the determined optical signal intensity and the determined optical signal threshold associated with the optical signal from the optical model 130 or the resist model 140. In some embodiments, the stochastic model 170 determines the optical signal intensity and the optical signal threshold independently of the optical model 130 and the resist model 140.

In some embodiments, extracting an optical signal contour using an optical signal threshold is performed. Extracting the optical signal contour can be performed stochastically. Generally, a contour line for a function of two variables, such as an optical signal intensity, I(x), and a point on a surface at which the optical signal is arriving, x, is a curve along which the function has a constant value, so that the curve joins points of equal value. In some embodiments, the optical signal contour is a plane section of the two-dimensional graph of the function I(x) parallel to the x-plane.

In some embodiments, a signal field associated with the optical signal is created. Afterwards, an optical signal threshold for pattern transfer associated with the optical signal is determined. In some embodiments, the optical signal threshold is a constant number. In some embodiments, the optical signal threshold is defined by a number of photons that are expected to arrive at a point (e.g., a cutoff dose) divided by a dose associated with an area. For example, if the optical signal threshold is 0.2 and the dose associated with an area is 20 photons per square nanometer, then a probability that a specific area with a cross-section of one square nanometer receives less, or more than, a cutoff dose of 4 photons (e.g., 20*0.2) indicates an uncertainty on formation of an edge on the specific area. In some embodiments, the edge does not have infinite slope and curvature at an optical signal threshold location, which once correlation effects of adjacent voxels (i.e., three-dimension pixels) are considered, results in a possible finite blurring. As an example, for a positive tone development, an optical signal above the optical signal threshold is assumed to be cleared, and an optical signal below the optical signal threshold is assumed to remain intact.

Figure 2:
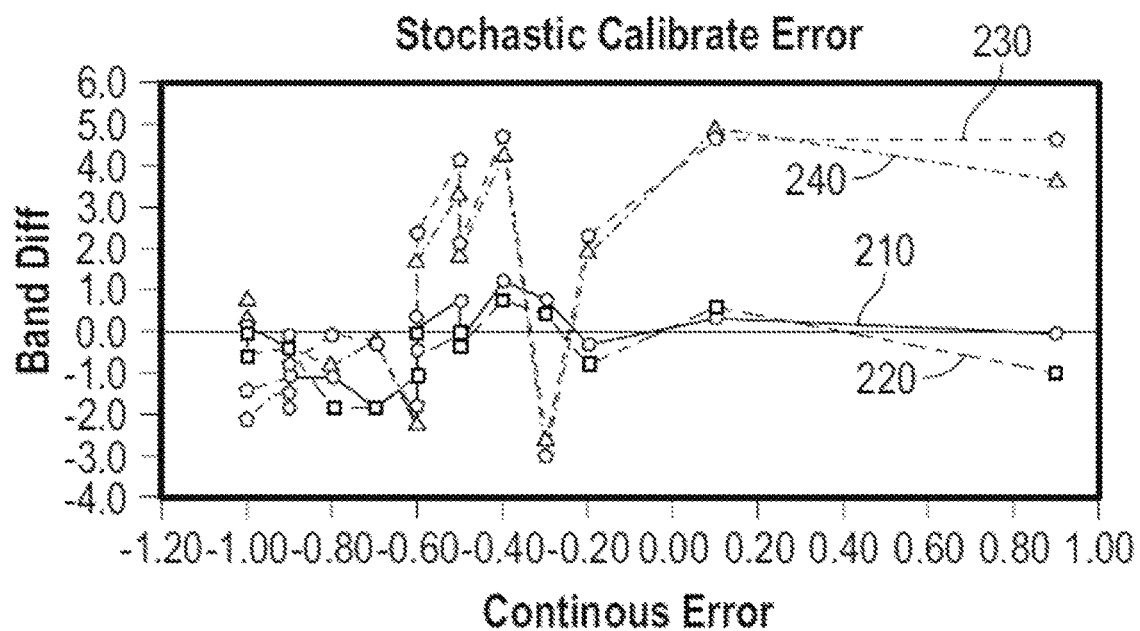
FIG. 2 depicts an improvement on the band value prediction with newer model, according to embodiments of the present disclosure.

FIG. 2 depicts improving a band value prediction with a stochastic model, in accordance with one embodiment of the present disclosure. A stochastic base error line 210 and a stochastic head error line 220 respectively identify a difference from the confidence band at the base and the head of a line when using the stochastic compact model described herein, which are contrasted against a continuous base error line 230 and a continuous head error line 240 as would be experience using a traditional continuous compact model. Placement of the confidence band depends on derivatives of the optical signal at the optical signal threshold. Additionally, in some embodiments, the placement of the confidence band depends on values which are within a correlation length of the confidence band.

In some embodiments, the optical signal arriving at a wafer has a photon count distributed according to a Poisson distribution or other distribution curve. A Poisson distribution is a discrete probability distribution that expresses a probability of a given number of events occurring in a fixed interval of time or space if these events occur with a known constant mean rate and independently of the time since the last event. In some embodiments, the distribution curve is used for a number of edge formations in a specified distance or area. For example, if a discrete random variable x has a Poisson distribution with parameter $\lambda > 0$, if, for k=0, 1, 2, ..., the probability mass function of x is given by:

$$f(k, \lambda) = Pr(X = k) = \frac{\lambda^k e^{-\lambda}}{k!} \qquad \text{Equation 1}$$

where e is Euler's number (e=2.71828 ...), k! is the factorial of k, and the positive real number $\lambda$ is equal to the expected value of x.

In some embodiments, a continuous signal field, which specifies a nominal measure of events happening, is determined. The continuous signal field may pertain to at least one of: a mean, a median, a mode, or any measure of number of events occurring. In some embodiments, the distribution curve is used to extract the confidence band around which the edge forms. Extracting the confidence band is performed based on a mean number of photons which arrives at the location. Additionally, in some embodiments, the mean number of photons arriving at the location is given by an applied dose and modulated by a pattern optical signal variation.

In some embodiments, the continuous optical signal, is a function of position, which is an output of a calibrated continuous model. The constant optical signal threshold (Th) may be obtained from the continuous model. In some embodiments, the method for predicting formation of a defect at a location by an optical signal in a lithography process uses a calibration of a gauge ends placement. Additionally or alternatively, in some embodiments, the method for predicting formation of a defect at a location by an optical signal in a lithography process uses the critical dimension (CD) variability. The CD indicates a process in which a size, (e.g., a width) of a feature printed in resist is measured at a specific height above the substrate. In such embodiments, indirect measure of variability (e.g., the LER or CD uniformity (CDU)) is substituted for the optical signal. The CDU is used to assure good performance and reliable functionality of a sample. In some embodiments, the CDU includes a total wafer CDU, a mask CDU, a resist process, a scanner and lens fingerprint, a wafer topography, etc. Further, in some embodiments, measure of defect count or pixNOK values are used for the optical signals.

In some embodiments, the optical signal threshold is calibrated via offsets. In such embodiments, the offsets (e.g., $\Delta d$ and $\Delta b$) are positive constants. The offsets to the optical signal threshold for the formation or clearing of the feature may result from a reduction, or an increase, in signal.

In some embodiments, predicting formation of a defect at a location by an optical signal in a lithography process includes determining a threshold for formation of the defect. In one embodiment, predicting formation of a defect at a location by an optical signal in a lithography process further includes determining a stochastic optical signal contour based on the determined threshold. To determine stochastic optical signal contours, the optical signal thresholds are determined. In one embodiment, the stochastic optical signal contours, e.g., $C_{const}^{d}$ & $C_{const}^{b}$, are determined based on the continuous optical signal, $\xi$, using offset optical signal thresholds (e.g., Th–$\Delta d$) and (Th–$\Delta b$). In some embodiments, the optical signal contours are calibrated using measured error band placement for each gauge correspondingly. In some embodiments, the optical signal contours are calibrated using rigorously computed error band placement for each gauge correspondingly. The calibrated contours (e.g., $C_{const}^{d'}$ and $C_{const}^{b'}$) can be used as the stochastic optical signal contours.

In some embodiments, stochastic optical signal contours are determined based on a contributing kernel. In order to determine the stochastic optical signal based on contributing kernels, K, the contributing kernel is calibrated. In some embodiments, at large distances, the contributing kernel approaches, or equals, to zero. In some embodiments, a calibrated contributing kernel volume is normalized for the computation. Additionally, in some embodiments, values of the calibrated contributing kernel are non-negative real numbers for all space domain for which the calibrated contributing kernel is defined.

As an example, the contributing kernel includes a suitably normalized constant. As another example, the contributing kernel includes a disc. As yet an example, the contributing kernel includes a Gaussian, a Lorentzian, a Cauchy, or a Voigt sphere or a linear combination thereof.

In some embodiments, the stochastic optical is determined based on Equation 2.

$$\xi_{corr} = \xi \otimes K_{corr} \qquad \text{Equation 2}$$

where $\otimes$ refers to the convolution operator which produces the stochastic optical signal. The produced stochastic optical signal expresses how a shape of the optical signal is modified by the contributing kernel.

Figure 3:
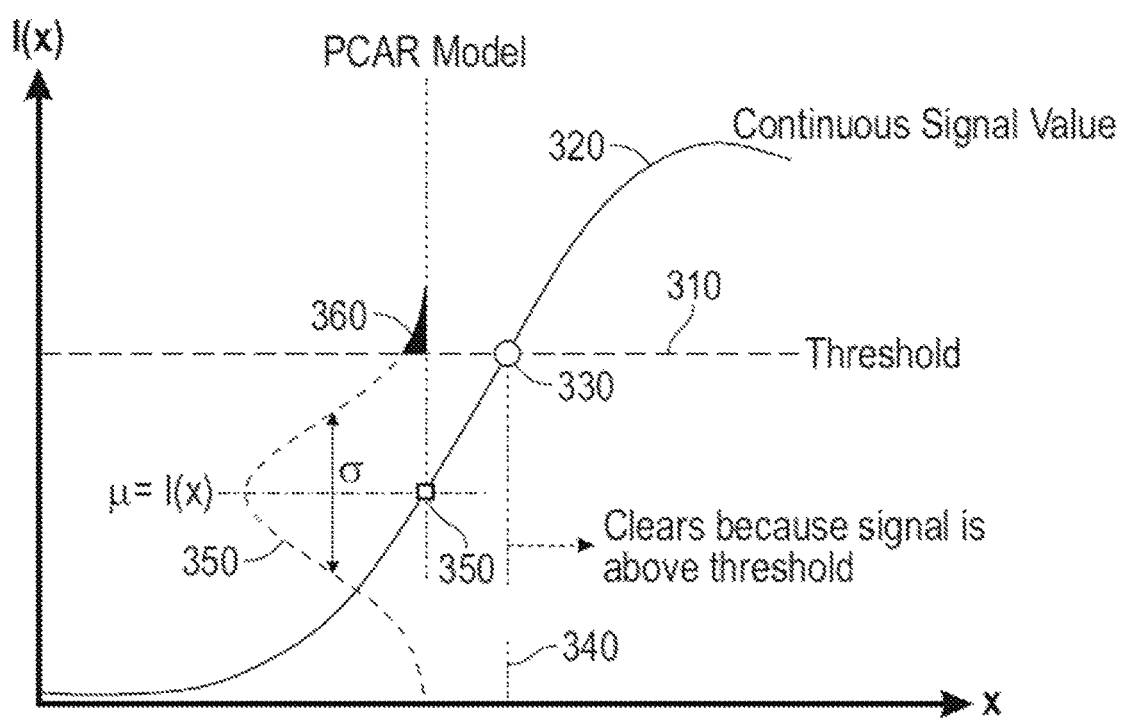
FIG. 3 depicts a Gaussian distribution to emulate the function F, according to embodiments of the present disclosure.

In some embodiments, the stochastic optical signal is determined based on a cumulative probability of a random variable. In such embodiments, $F(X\{\theta_i\})$ is used as the cumulative probability of the random variable X, which is parametrized by a set of parameters $\{\theta_i\}$. In some embodiments, $\Theta(X)$ is used as the set of parameters estimate ($\{\hat{\theta}_1\}$). In some embodiments, the stochastic optical signal is determined based on equation 3. FIG. 3 depicts a Gaussian distribution to emulate the function F to determine the stochastic optical signal.

$$\xi_s = F(X\{\hat{\theta}_i\}) = F(X(\Theta(X))) \qquad \text{Equation 3}$$

In some embodiments, a suitable probability distribution and parameters associated with the probability distribution for random variable X are determined using calibrated data obtained from the wafer or simulation. Similarly, in some embodiments, the suitable probability distribution and parameters associated with the probability distribution for random variable X are determined through numerical and analytical computation methods. In some embodiments, the signal band is calibrated. In some embodiments, portions of the signal band are calibrated.

In some embodiments, a defect measure for each gauge is determined. In order to determine the defect measure, the determined stochastic optical signal is used. The defect measure is determined based on Equation 4.

$$D_{gauge} = \iint_{-defect\ range}^{+defect\ range} \xi_s dA \qquad \text{Equation 4}$$

In Equation 3, the defect range starts, and ends, at a pre-defined position and is integrated over a defect definition domain area. In such embodiments, the definition of defect range specifies the probability, distance or a percentage change in edge placement or CD variation. In some embodiments, the determined values of $D_{gauge}$ are further tuned via calibration data. Alternatively, in some embodiments, the determined values of $D_{gauge}$ are used for verification against simulated data or measured data. The defect measure is used for repeating patterns, such as lines and spaces, contact holes, cut lines etc. or a generalized 2-dimensional field and area of concern.

FIG. 3 illustrates how the continuation signal value is used to determine the probability of edge clearing. In some embodiments, the continuous model determines the optical signal threshold 310 which in turn determines the edge location. In some embodiments, for a positive tone development (PTD) resist, upon determining that the optical signal intensity at a location is above the optical signal threshold 310, the location is assigned as a space where no resist is applied. Afterwards, an optical signal contour is drawn around the location.

In some embodiments, the optical signal field generated for the continuous optical signal gives a median value of getting such an optical signal. Additionally, in some embodiments, the probability of events occurring a given distance away from the median location is given by a stochastic signal 320 having a normal or Gaussian distribution. Photo resist edges are predicted as forming in the region positioned to the right of the vertical line 340 that crosses point 330, i.e., the point at which the stochastic signal 320 and the optical signal threshold 310 intersect.

The probability of forming an edge at point 330, i.e., the point at which the stochastic signal 320 and a resist model defined by vertical line 340 intersect, is determined by the area of region 360 of a Gaussian distribution 350 shown as having a mean value of μ and a standard deviation of σ. As is seen, region 360 is shown as being outside the ±1σ range (i.e., more than one standard deviation from the mean).

In FIG. 3, in some embodiments, a value of variances of the Gaussian distributions are determined based on at least one of: a dose at the location (dose), a resist photo absorption factor (abs), a secondary electron yield (SEY), an acid concentration ($C_A$), an acid yield (AY), a quencher concentration ($C_Q$), PEB enhancement factor ($K_{PEB}$), and a constant owing to dark loss. In some embodiments, the value of variance is determined based on Equation 5.

$$\sigma^2 \approx K_{PEB} \times (dose \times abs \times SEY \times C_A \times AY - C_Q) + constant \qquad \text{Equation 5}$$

Additionally or alternatively, in some embodiments, the parameters in Equation 5 are grouped, using two parameters a and b (which can be calibrated), to derive Equation 6. In some embodiments, values of a are positive and bigger than zero. In some embodiments, values of b can positive, or negative. In some embodiments, values of b are limited.

$$\sigma^2 \approx a*dose+b \qquad \text{Equation 6}$$

In some embodiments, the stochastic optical signal is determined based on Equation 7.

$$P(x) = 1 - \frac{1}{2}\left(1 + \text{erf}\left(\frac{Y-\mu}{\sigma\sqrt{2}}\right)\right) \qquad \text{Equation 7}$$

where Y is a random variable and is determined by Equation 8

$$Y \sim N(\mu, \sigma^2) \qquad \text{Equation 8}$$

where μ,σ are the parameters of normal distribution corresponding to the mean and standard deviation.

In some embodiments, the optical signal threshold as defined for the optical signal is used to determine the nominal signal. In some embodiments, the area is an open frame area. In such embodiments, the optical signal intensity is determined by multiplying the optical signal intensity with a scalar factor. In some embodiments, an effective number of photons increases by correlations which happen at the local voxel, i.e., three-dimensional pixel, from nearby voxel. In such embodiments, a calibration factor, $k_p$, is used to determine the optical signal intensity. In some embodiments, the calibration parameter is the same for making sense of optical signal threshold as well as signal intensity. In some embodiments, a fraction of the photons arriving at the location x are adsorbed. Thus, in some embodiments, a correction factor, $k_c$, is determined to account for the fraction of the optical signal which is absorbed.

Afterwards, the probability distribution is determined based on Equation 9 and 10.

$$(x) = \frac{1}{2} - \text{erf}\left(\frac{k_p \times Th - k_p \times I(x)}{\sqrt{2}\left(k_c\sqrt{k_p \times I(x)} + C'\right)}\right) \quad \text{Equation 9}$$

$$P(x) = \frac{1}{2} - \text{erf}\left(\frac{Th - I(x)}{\sqrt{a \times I(x) + b}}\right) \quad \text{Equation 10}$$

As is seen from Equation 10, in accordance with one aspect of the present disclosure, the probability distribution function of forming a defect at point x is determined in accordance with a defined threshold value Th, the intensity of the optical signal at point x, parameters a and b, defined above and an error function (erf). In some embodiments, for the other side of the distribution the P(x) is determined by Equation 11.

$$P(x) = \frac{1}{2} + \text{erf}\left(\frac{Th - I(x)}{\sqrt{a \times I(x) + b}}\right) \quad \text{Equation 11}$$

Figure 4:
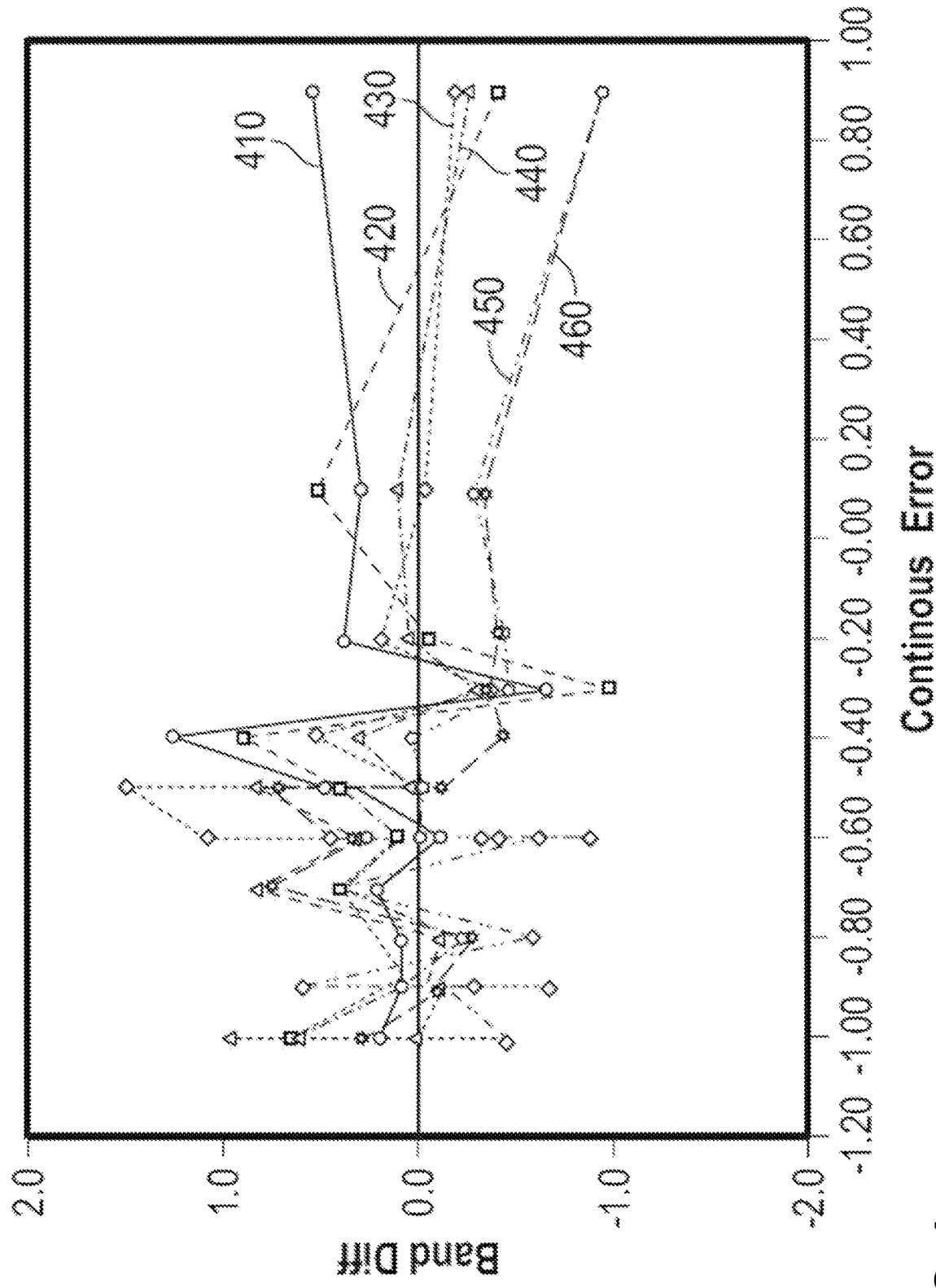
FIG. 4 depicts how different confidence bands can be calibrated at one time on the model, according to embodiments of the present disclosure.

As an example, to calibrate to P(x)=0.95, the optical signal threshold is set to 0.45. FIG. 4 depicts how different confidence bands could be calibrated in parallel on the stochastic model 170. Residuals 410-450 from such a method are also plotted in FIG. 4, where multiple band residuals 410-450 (e.g., residuals for confidence bands with progressively higher confidence percentages) are compared with the rigorous model calculation 460.

In some embodiments, information for generating continuous contour are provided by the optical signal and the optical signal threshold. Further, in some embodiments, the optical signal value is known for the entire optical signal field. Additionally, in some embodiments, data are obtained from rigorous simulator such as s-litho, or directly measured from the wafer. In such embodiments, stochastic bounds for contour generation are determined based on Equation 12.

$$S(x,y) = \text{threshold} \quad \text{Equation 12}$$

In some embodiments whether the probability for a location gets developed away depends on the set of optical signals that is about the location. For example, if the probability of signal generates an optical signal that is beyond the optical signal threshold, then a transformation $\wp(S(x, y)) \equiv \wp(x,y)$ is applied to the optical signal. In some embodiments, $\wp$ represents the cumulative probability, hence, is monotonic. The probability is then determined by Equation 13.

$$P(x,y) = \Sigma \wp(x,y) K(x-x_i, y-y_i) \quad \text{Equation 13}$$

where K(x',y') represents the contributing kernel. In some embodiments, the contributing kernel has decreases to vanishing values very far away from the center. In some embodiments, a location near the location x has a higher contribution kernel compared to the distant values. In some embodiments, the contributing kernel is represented by a Gaussian representation, a hyper/super Gaussian representation, a Lorentzian representation, a Voigt representation, etc. Alternatively, in some embodiments, the contributing kernel is represented numerically. Equation 14 can determine the stochastic band.

$$S(x,y) = \text{Stochastic threshold} \quad \text{Equation 14}$$

In some embodiments, the method is repeated for the stochastic band that infers the other side of the optical signal with different optical signal threshold value. If the contributing kernel is well-known and a mechanism for the formation of optical signal contour of all optical signal values are the same, the same contributing kernel is used for both stochastic bands, otherwise determining a contributing kernel specific to the stochastic band might be necessary.

Figure 5:
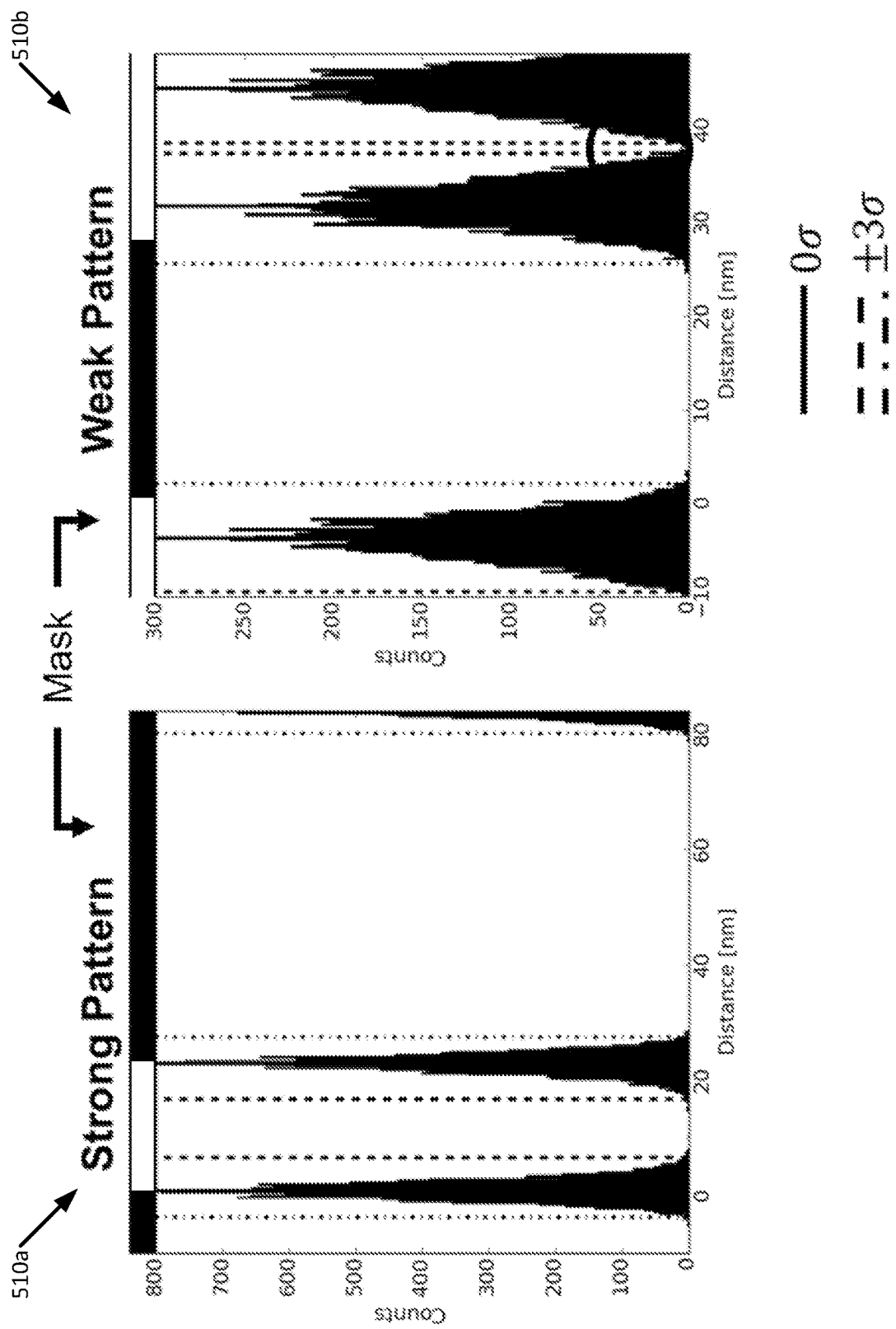
FIG. 5 illustrates edge distributions and for a first and a second lithographic patterns, respectively, according to embodiments of the present disclosure.

FIG. 5 illustrates measured edge distributions 510a and 510b for a first and a second lithographic patterns, respectively, according to embodiments of the present disclosure. The first edge distribution 510a is shown with respect to a strong pattern (also referred to as a positive pattern) in which the edges are (nominally) formed where an edge of the photoresist pattern is applied. The second edge distribution 510b is shown with respect to a weak pattern (also referred to as a negative pattern) in which the edges are (nominally) formed where the photoresist is not applied (i.e., forming a negative image relative to the applied pattern). All edges in any lithographic pattern (whether strong/weak or positive/negative) may appear in a different relative location than where that edge was placed on the mask. Stochastic process variation causes each edge to be governed by a probability distribution. When the variance of this distribution is small, this appears as LER but is unlikely to cause stochastic failure (e.g., where nonconformances occur within a statistically or probabilistically measurable chance, but cannot be predicted precisely). When the variance is larger, or when edges are closer together, stochastic failure due to edge variation becomes more likely. The probability distributions may appear to be normally distributed, but this is known to not be the case.

Monte Carlo simulations can provide accurate simulations of the statistics for a small area (on the order of a single $\mu m^2$ (square micrometer)), but this type of simulation is resource intensive and impractical to apply to a full chip (which can be as large as 858 $mm^2$ (square millimeter). It is essential to EUVL process development that this type of edge position variation can be predicted at full chip scale. A predictive model allows OPC technologies to compensate for and design around stochastic effects in chip patterns.

The present disclosure provides embodiments that simplify the modeling process by fitting stochastic compact models directly to experimental data. The present disclosure also provides embodiments that reduce the time involved in fitting a stochastic compact model to the experimental data.

As used herein, the CD of a feature refers to the width of that feature at a given location and is measured by a scanning electron microscope (SEM). LER is a common issue in modern lithography processes, so the mean CD is generally of the most concern to lithographers. LER is also measured by a CD-SEM and is calculated as the standard deviation of the edge location. This number is typically scaled by three standard deviations and referred to as "3σ LER". Alternatively, the standard deviation of the CD could be used when scaling. In that case, the measurement is called line width roughness (LWR) if the pattern is one dimensional, or CDU if the pattern is two dimensional. This disclosure may at times use LER, LWR, CDU, or simply "roughness" interchangeably. Unless otherwise noted, where one of these terms applies the others do as well.

As used herein, a compact model refers to a model which is fast to evaluate and is applicable at full-chip scale of correction (via e.g., optical proximity correction, inverse lithography technology) or verification (e.g., lithography rule checking). Compact models take a set of graphics representing the mask pattern as input. The output of the model is a signal which can be evaluated at any point in the plane bounded by the input graphics. The compact model also includes a threshold which can be used to find a contour from the model signal. The goal of the compact model is for this contour found from the model signal to predict the continuous mean edge location of the photoresist. In this disclosure, a traditional compact model can be referred to as the continuous model, the continuous compact model, the continuum model, the continuum compact model, or the like.

A stochastic compact model can be applicable at full-chip scale, but the goal of a stochastic compact model, in contrast to a continuous compact model, is instead to predict the probabilistic edge location. Stated differently, the continuous model identifies the mean edge location, while the stochastic model identifies a range of locations within a given confidence interval where the edge location is expected to be formed (e.g., an edge location range). The present disclosure relates to using experimental roughness data to fit a stochastic compact model.

Figure 6:
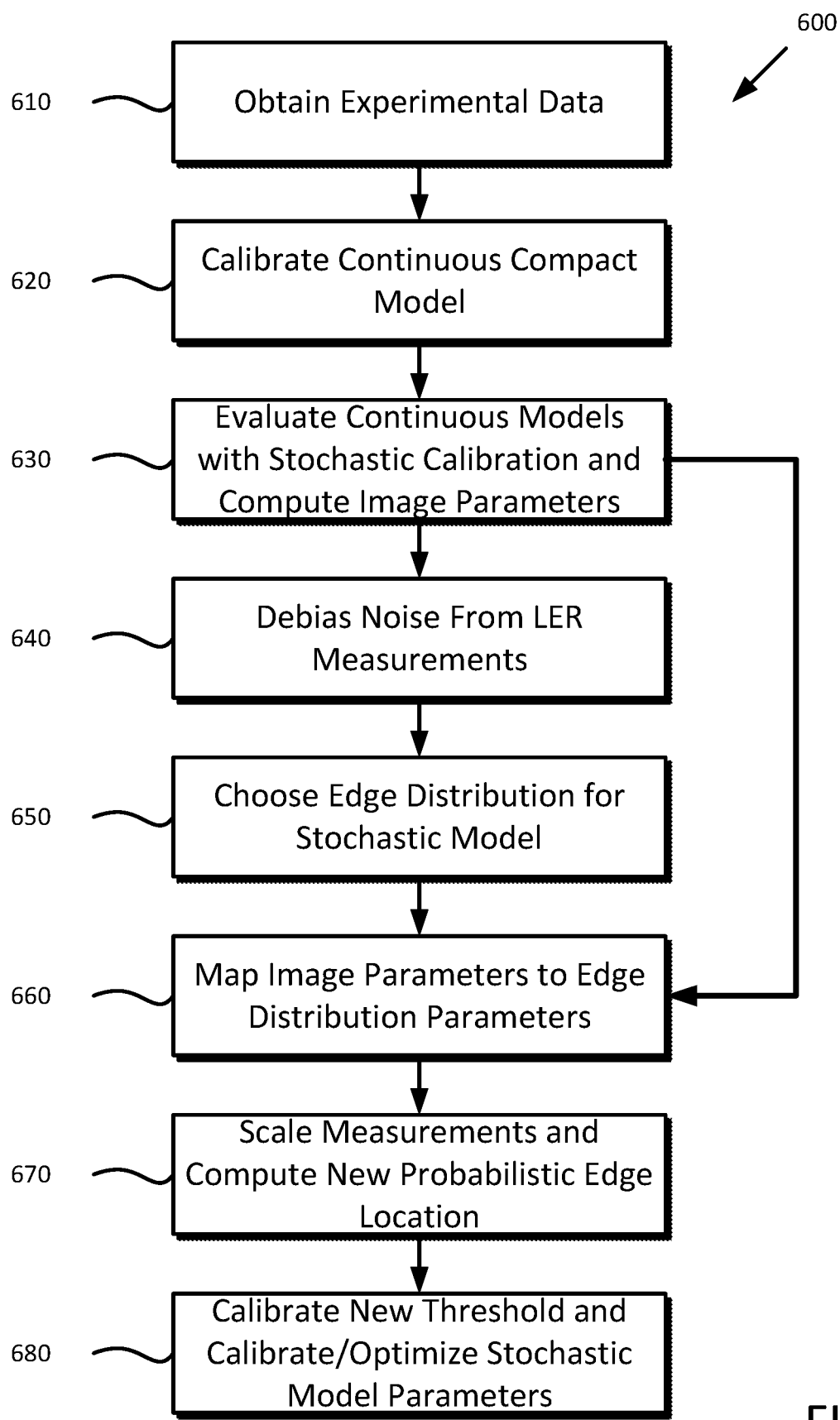
FIG. 6 is a flowchart of a method for calibrating a stochastic compact model to experimental data, according to embodiments of the present disclosure.

FIG. 6 is a flowchart of a method 600 for calibrating a stochastic compact model to experimental data, according to embodiments of the present disclosure. Method 600 begins at 610, where a modeling device obtains experimental data to calibrate the stochastic model. In various embodiments, the modeling device can be a special purpose or a general purpose computer, such as the computer system 1300 discussed in FIG. 13. The experimental data in the present disclosure can include two or more different sets of data that are gathered from production runs of the mask that identify process variations in producing the masks.

The first set includes the data used to calibrate the continuous (traditional) compact model. These data can include (but are not limited to) CD measurements and contours extracted from SEM micrographs. The data in the first set may include a range of altered process conditions. For example, the first set of data may include data for defocus positions and exposure doses besides the nominal condition. T The second set of data from the experimental data set is specific to calibrating the stochastic compact model. These data include statistical measurements of process variation, which can include (but are not limited to) line width roughness (LWR), line edge roughness (LER), and critical dimension uniformity (CDU). These data include process conditions besides the nominal condition. Possible variations include, but are not limited to: defocus, dose, and photoresist thickness. These variations may include process conditions which are either close to or very different from the nominal condition. Accordingly, collecting process conditions that replicate the complete range of LER variability can enhance the fitting process and the stochastic model.

Figure 7A:
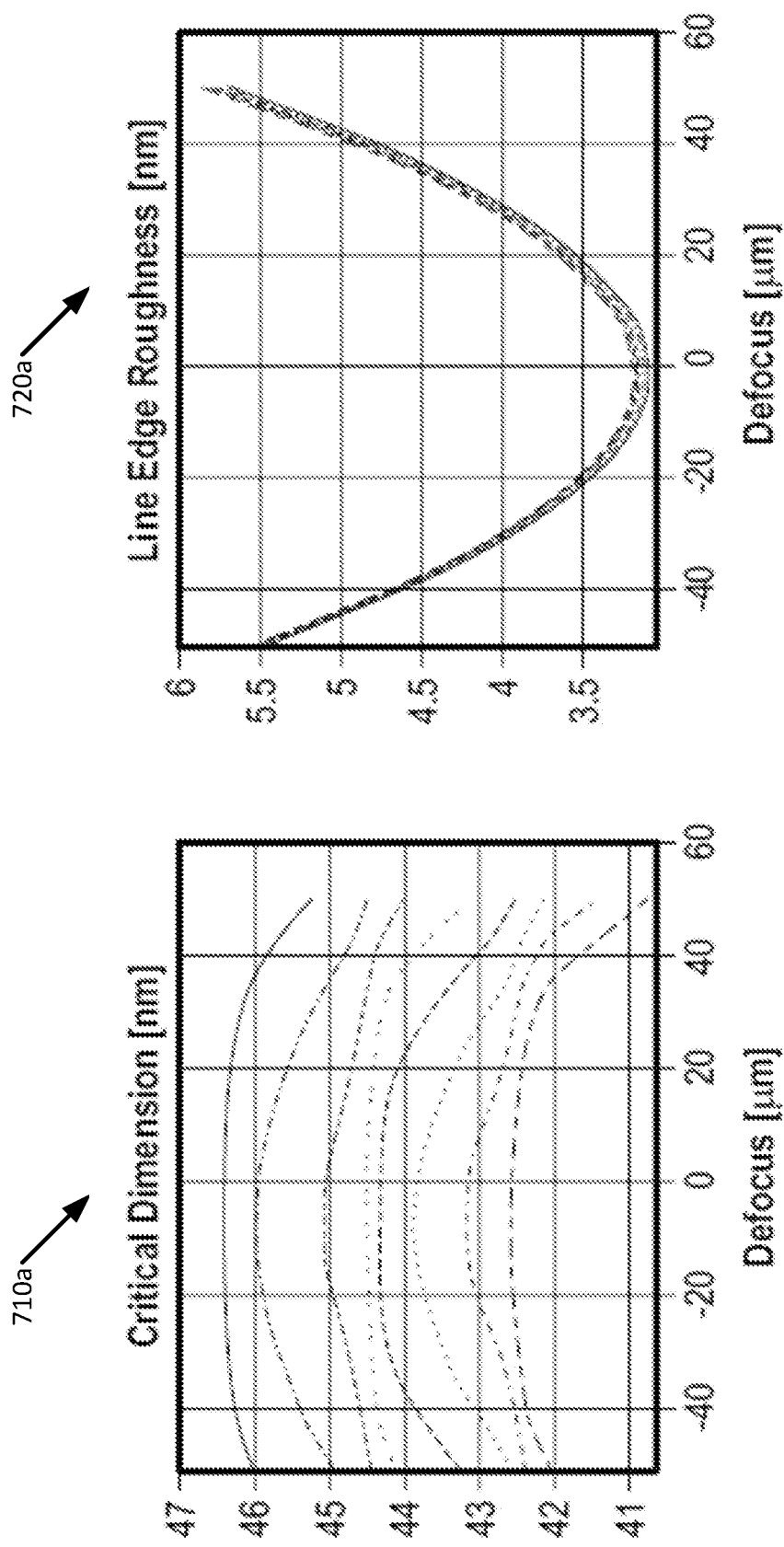
FIGS. 7A and 7B illustrate the type of data recommended for fitting a stochastic compact model for two different pattern types on the mask, according to embodiments of the present disclosure.
Figure 7B:
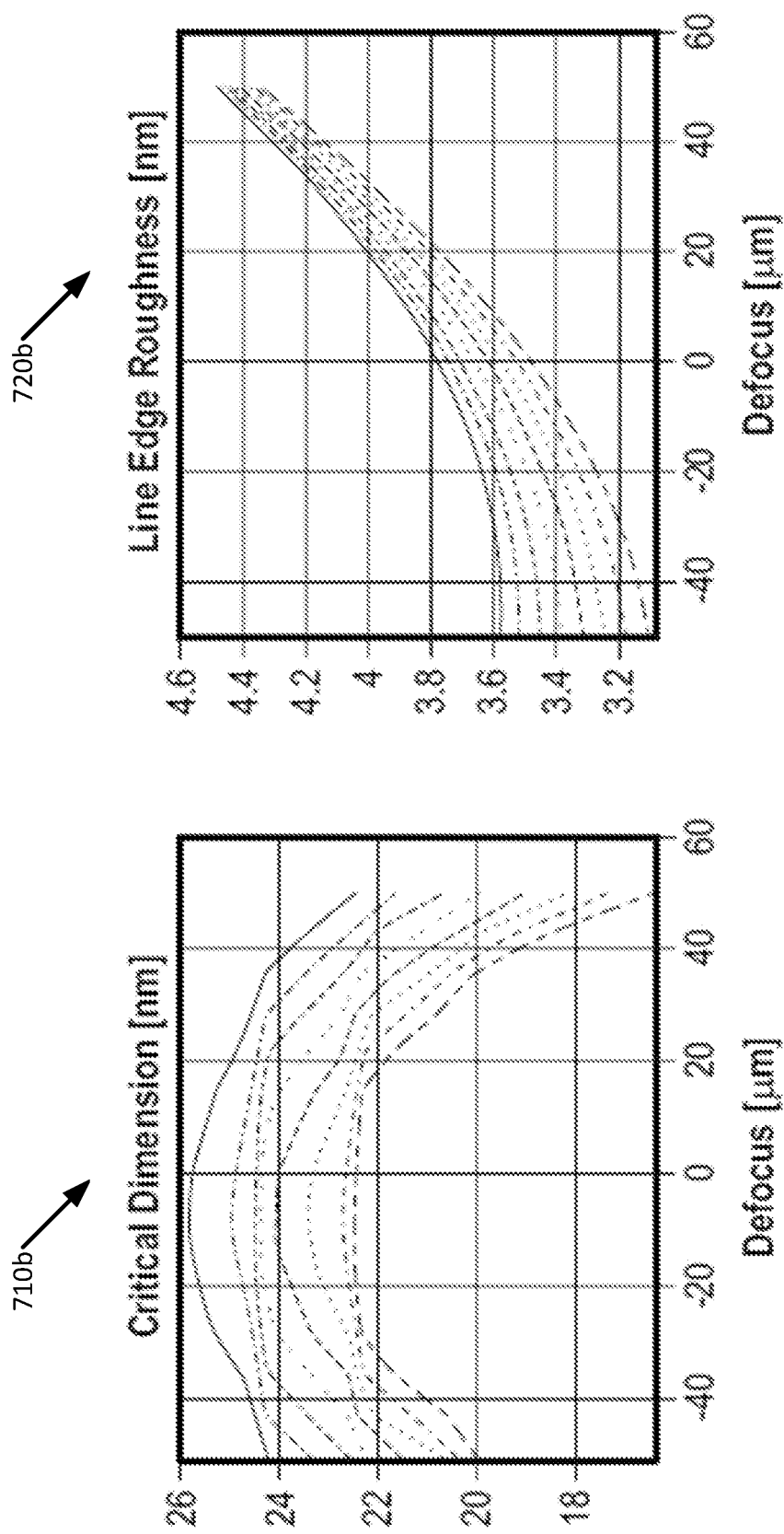

An example of the type of data recommended for fitting a stochastic compact model is shown in FIGS. 7A and 7B for two different pattern types on the mask. In this case, the CD data 710a, 710b are used for calibrating the continuous compact model and the line edge roughness (LER) data 720a, 720b are used for calibrating the stochastic compact model.

In both sets of experimental data, measurements are taken for a variety of mask geometries. Each measurement location on the mask is referred to herein as a gauge. The variety of mask geometries can be taken randomly, encompass a user-defined subset of the mask geometries, include all of the mask geometries accessible to the modeling device, or the like.

A high energy electron beam of the SEM can change the photoresist pattern being measured. To account for this, optionally, the calibration data for either or both the continuous and stochastic models can be collected with different SEM settings (e.g., number of scans, electron beam energy, etc.). The differences between the various measurements of the same pattern at different SEM settings can give information about the influence of the SEM on the measurement. For example, measuring the same pattern twice using two different electron beam energies can give different CD values. The difference between these measurements is due to the influence of the SEM, and is unique to each pattern. This information can be used to correct the CD, LWR, LER, and CDU measurements prior to the subsequent operations of method 600.

At 620, the modeling device calibrates the continuous compact model of the resist mask based on the experimental data. In one embodiment, the continuous compact model represents a continuous and smooth function to describe the mean edge locations observed across the different measurement sites in the production data across various specified locations on the wafer design. The gauges used to calibrate the continuous model can be, but do not need to be, the same gauges used for the stochastic calibration. For example, a model fit directly to SEM contours can be calibrated in a different way than a model fit to discrete CD measurements. Ultimately, either model is compatible with the present disclosure and the calibration procedure of the continuous model does not affect the systems and methods described herein.

After collecting data and calibrating the continuous compact model, method 600 proceeds to 630, where the modeling device evaluates the continuous model based on the graphics corresponding to the gauges to be used for calibrating the stochastic compact model (per block 660). Graphics, in this case, refer to a digital representation of the mask design. This simulation is used for extracting image parameters from the stochastic calibration gauges. Calibration and extraction can include (but are not limited to) the edge location, the maximum signal along the gauge, the slope at the mask edge, etc. Any quantity which can be derived from the compact model signal may be collected during calibration and used in debiasing, edge distribution, simulation, and fabrication.

When evaluating the continuous model, the modeling device calibrates the continuous model for the paired graphics (e.g., vertical line images with a relatively higher probability of printing) and measured gauges (e.g., critical dimension measurements) to compute a continuous signal field for new graphics (e.g., vertical line images with a relatively lower probability of printing) and measured gauges (e.g., critical dimension and line edge roughness measurements) that include stochastic measurements for the edge locations. The stochastic measurements indicate a probability for an edge location occurring at a given physical location, and are used by the modeling device to identify and map a function that described these stochastic properties.

In various embodiments, compact models can be composed from several convolution kernels in superposition, although calibration can be performed using a subset of the entire set of kernels. For example, a typical compact model will contain kernels corresponding to the optics of the lithography process and other kernels corresponding to the photoresist. The signal derived from using only the optical kernels is considered a subset of the continuous compact model. Therefore, image parameters can be computed from many different signals derivable from the compact model.

At 640, the modeling device debiases noise from the LER measurements. All experimental measurements will have some degree of noise included. The largest source of noise comes from the SEM but this is not the only source. SEM noise is tolerable in fitting a traditional compact model, but may strongly impact the fitting power of a stochastic compact model.

Figure 8A:
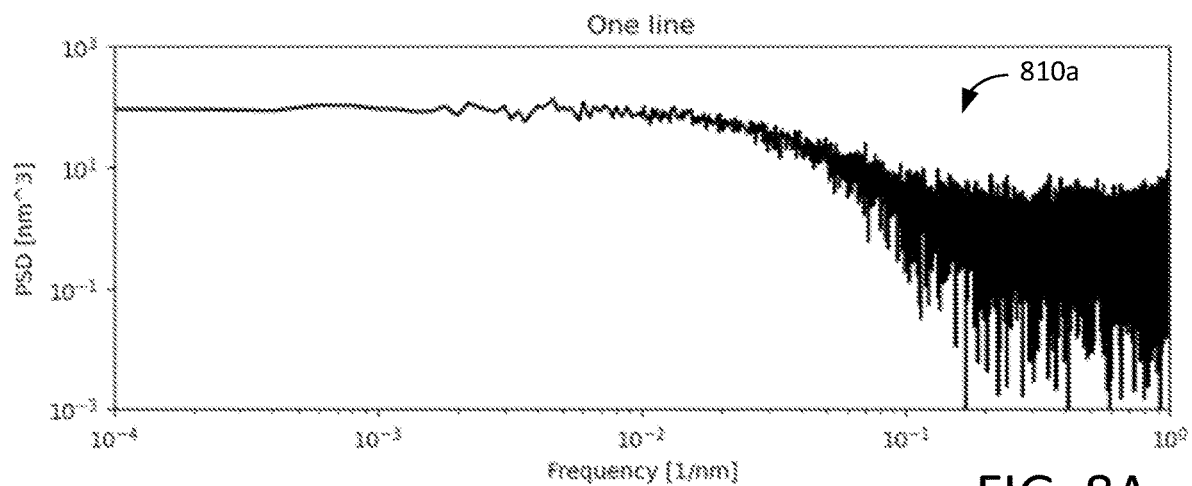
FIG. 8A-8D illustrate noise floors for roughness measurements, according to embodiments of the present disclosure.
Figure 8B:
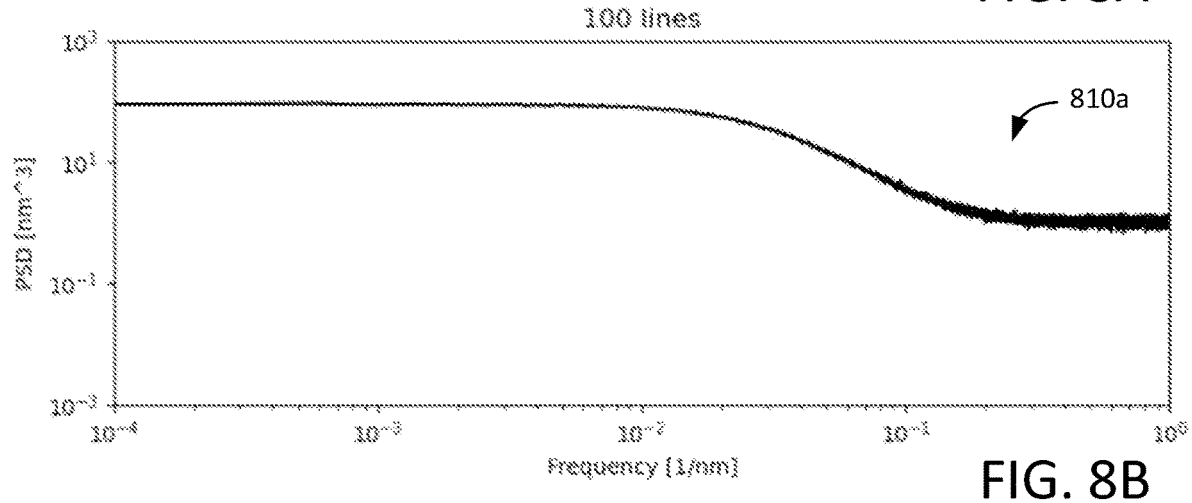
Figure 8C:
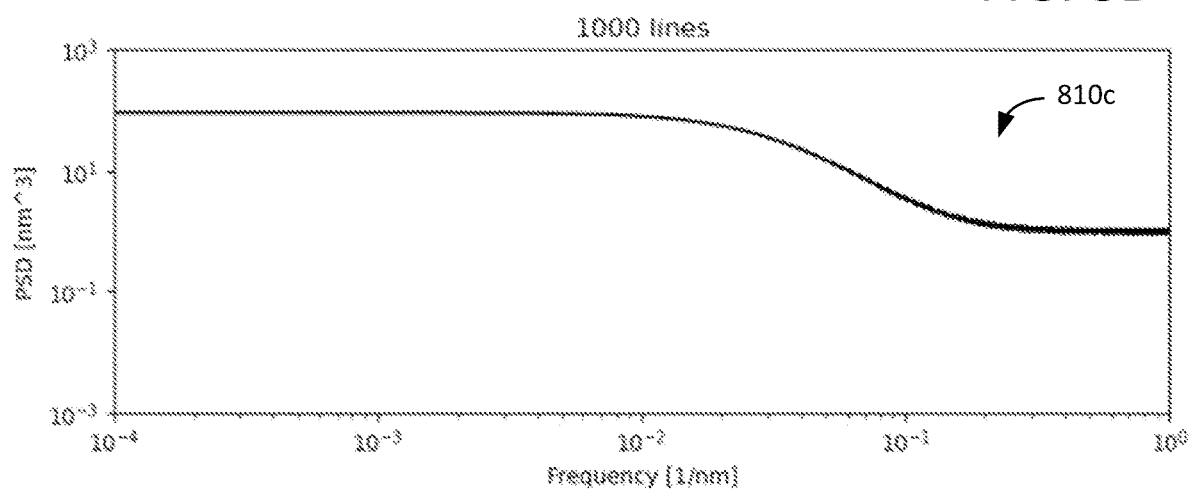

It is common practice in lithography to analyze process variation in the frequency domain, as shown in FIGS. 8A-8D. These curves are generated by transforming the edge profile into the frequency domain via a Fourier Transform, and then computing the power spectral density (PSD). The PSD obtained from a single line can be noisy, but can be improved through averaging the PSD of many nominally identical features, as seen in FIG. 8A-8C in regions 810a-c. The first region 810a corresponds to a PSD obtained from one line, the second region 810b to a PSD obtained from one hundred lines, and the third region 810c to a PSD obtained from one thousand lines. As will be seen, the area of the regions 810a-c indicate a level of noise in the measurements, which is reduced as the number of lines measured increases.

Figure 8D:
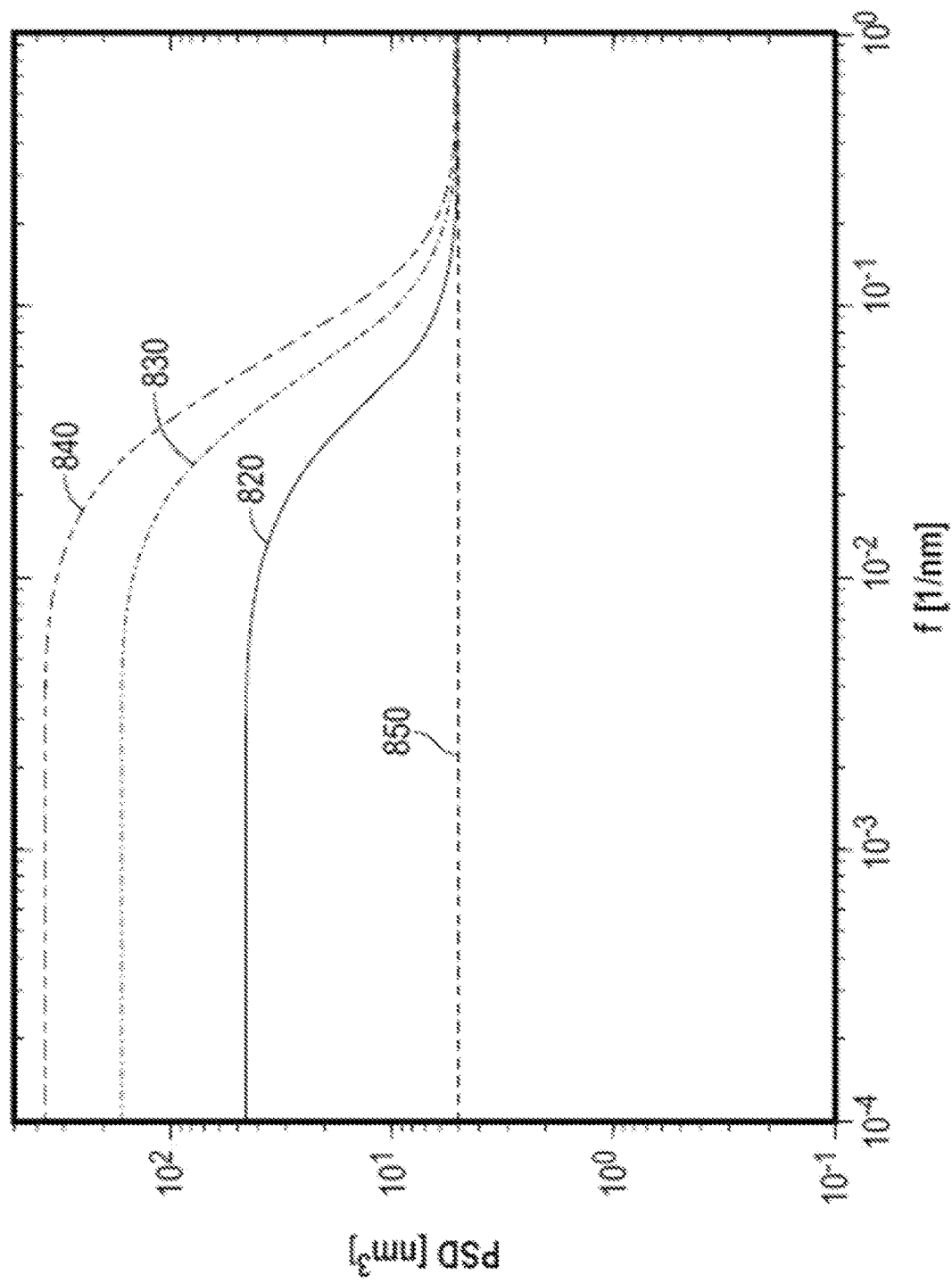

The area under the PSD is related to the variance of the process. Thus, the area is not directly equal to but is related to the LER or LWR measured by a CD-SEM. Still, there is some point in the higher frequency regime where the PSD flattens. This point corresponds to the noise in the process and is called the noise floor. This is illustrated in FIG. 8D where several ideal PSDs 820, 830, 840 for different roughness values (e.g., a highest roughness value in ideal PSD 840, a middle roughness value in ideal PSD 830, a lowest roughness value in ideal PSD 820) are plotted along with the noise floor 850.

In one embodiment of the present disclosure, the modeling device removes the noise from the measurement prior to model calibration. One possible way to remove the noise is to assume that the noise is constant between measurements and thus represents a constant area under the PSD. The unbiased measurement can then be found according to Equation 15 below:

$$\sigma_{unbiased} = \sqrt{(\sigma^2_{biased} - \sigma^2_{Noise})} \qquad \text{Equation 15}$$

The present disclosure does not require the use of a specific debiasing procedure, but can remove the process noise from the measurement by various procedures. In various embodiments, debiasing can be omitted entirely.

At 650, the modeling device chooses an edge distribution. There are many different probability distributions that arise in different circumstances. Every source of stochastic variation in a lithography process may have an individual and unique distribution. The central limit theorem of statistics states the distribution of a sum of independent random processes tends toward a normal distribution. However, that does not mean the edge distributions should be assumed to be normally distributed. Stochastic events in a lithography process may not be statistically independent, and the central limit theorem only predicts the tendency of the final distribution.

In practice, edge distributions, such as those shown in FIG. 5, can be close to normally distributed, but are slightly skewed. A distribution can be compared to the normal distribution by comparing how the quantiles of the distribution in question compare to the quantiles of the normal distribution. This is called a QQ plot and is shown in FIGS. 9A and 9B for two different distributions.

Figure 9A:
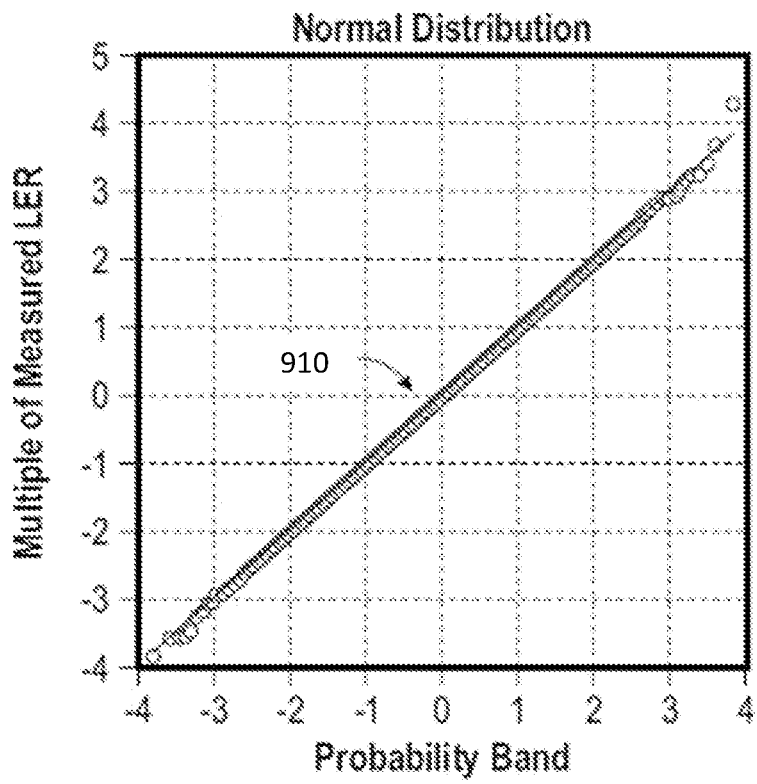
FIGS. 9A and 9B illustrate QQ plots for two different distributions, according to embodiments of the present disclosure.
Figure 9B:
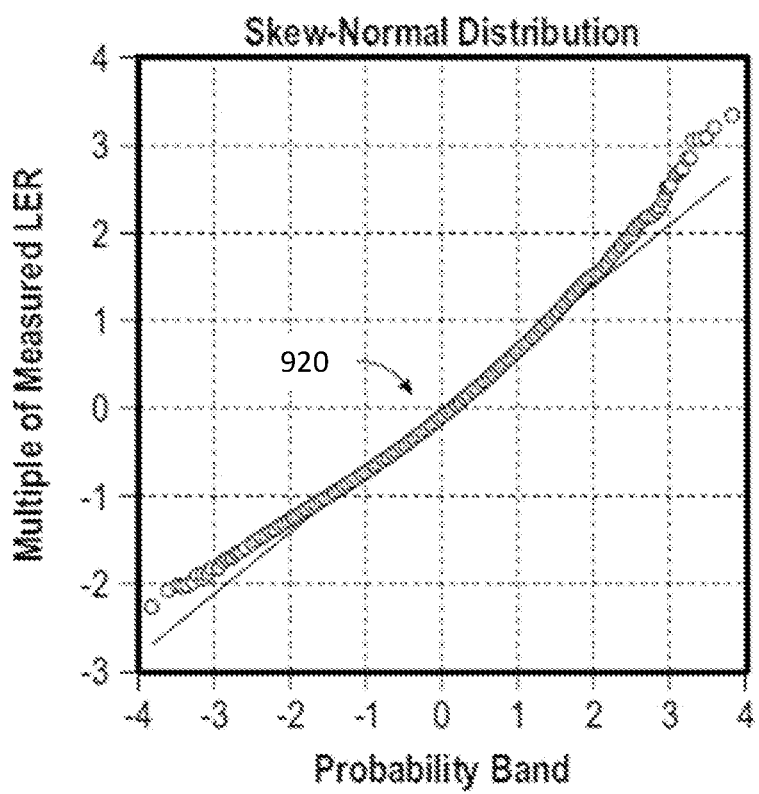

In FIG. 9A, a normal distribution of measure values 910 is compared against a normal distribution, and so the QQ plot is perfectly linear. In FIG. 9B, the same analysis is done for a skew-normal distribution of measurement values 920. In this case, the skewness of the distribution causes some quantiles to occur earlier or later than those quantiles would occur in a normal distribution.

The present disclosure therefore does not require the assumption of normality in the distribution. However, in some embodiments, an edge probability distribution type is chosen a priori. Possible types include, but are not limited to, normal, skew-normal, and Poisson. In one embodiment, each edge is allowed to have an individual probability distribution. In other embodiments, the two edges of each gauge can have the same distribution, but each gauge has a different distribution. In further alternative embodiments, every gauge shares the same distribution.

Figure 10:
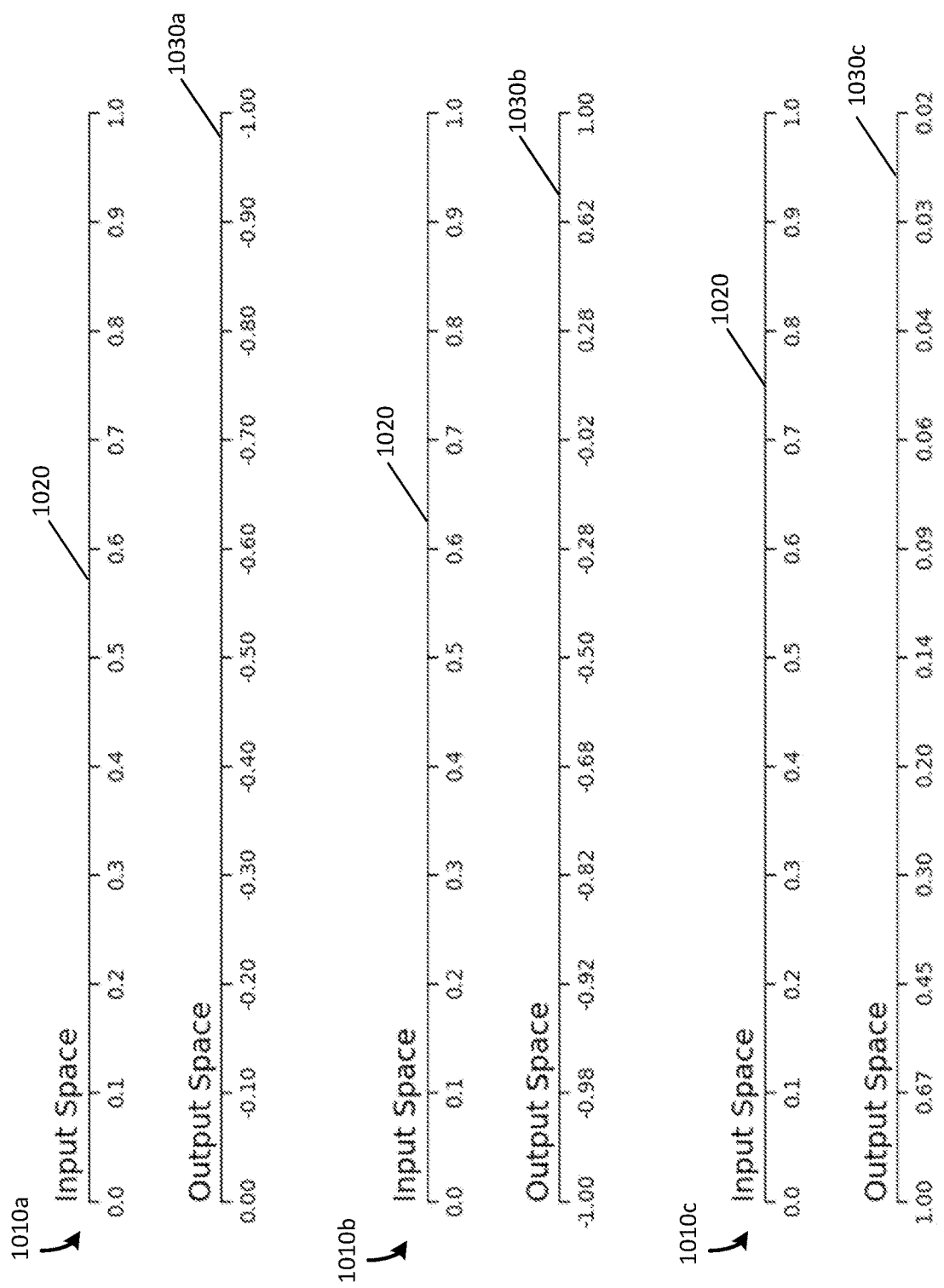
FIG. 10 illustrates three potential mappings that provide the modeling device with the ability to match the experimental data to a non-Gaussian distribution with a selected mean, standard deviation, variance, and skewness, according to embodiments of the present disclosure.

At 660, the modeling device maps the image parameters (e.g., from 630) to the edge distribution parameters (chosen per 650) according to the functional description of the distribution of edge locations. The functional description models variations or perturbations from the mean locational value (represented in the continuous compact model) and may be represented as two functions (one for positive variations and one for negative variations from the mean value) or one asymmetric function to account for different behaviors that result in edge location ranges above or below the mean value. FIG. 10 illustrates three potential mappings 1010a, 1010b, 1010c that provide the modeling device with the ability to match the experimental data from an input space 1020 to a non-Gaussian distribution in a respective output space 1030a-c with a selected mean, standard deviation, variance, and skewness that correspond to different edge distribution parameters according to the selected functional description.

At 670, the modeling device scales the locational measurements and probabilistically computes new edge location ranges based on the selected and mapped edge distributions. In various embodiments, the modeling device scales the locational measurements out from 1σ to a desired amount of deviation (e.g., xσ) to determine within a desired probability range the locations of that the edges could extend to. Stated differently, the collected data are extrapolated outward based on the confidence band selected for use in the stochastic compact model. The new edge location ranges indicate an outer bound for the predicted edges locations within the desired amount of deviation from the mean.

At 680, the modeling device sets (e.g., calibrates) a new threshold and sets (e.g., calibrates/optimizes) the stochastic model parameters accordingly. Stated differently, at 680, the modeling device applies the stochastic compact model to the resist mask design to allow a developer to adjust the resist mask to produce a chip at confidence for manufacturing yield. The threshold indicates a position in the contour of an optical signal that the parameters of the stochastic model are adjusted to ensure an optical signal is able to transmit as specified through the chip. Method 600 may perform 680 for several iterations (e.g., in an optimization loop) to thereby adjust and update parameters of the stochastic compact model and/or the threshold until the output signal from the stochastic compact model satisfies the design requirements for the new threshold. Once the stochastic model is finalized, the modeling device can output the stochastic model to a fabricator to produce a chip or wafer using the resist mask modeled by the stochastic model.

Figure 11:
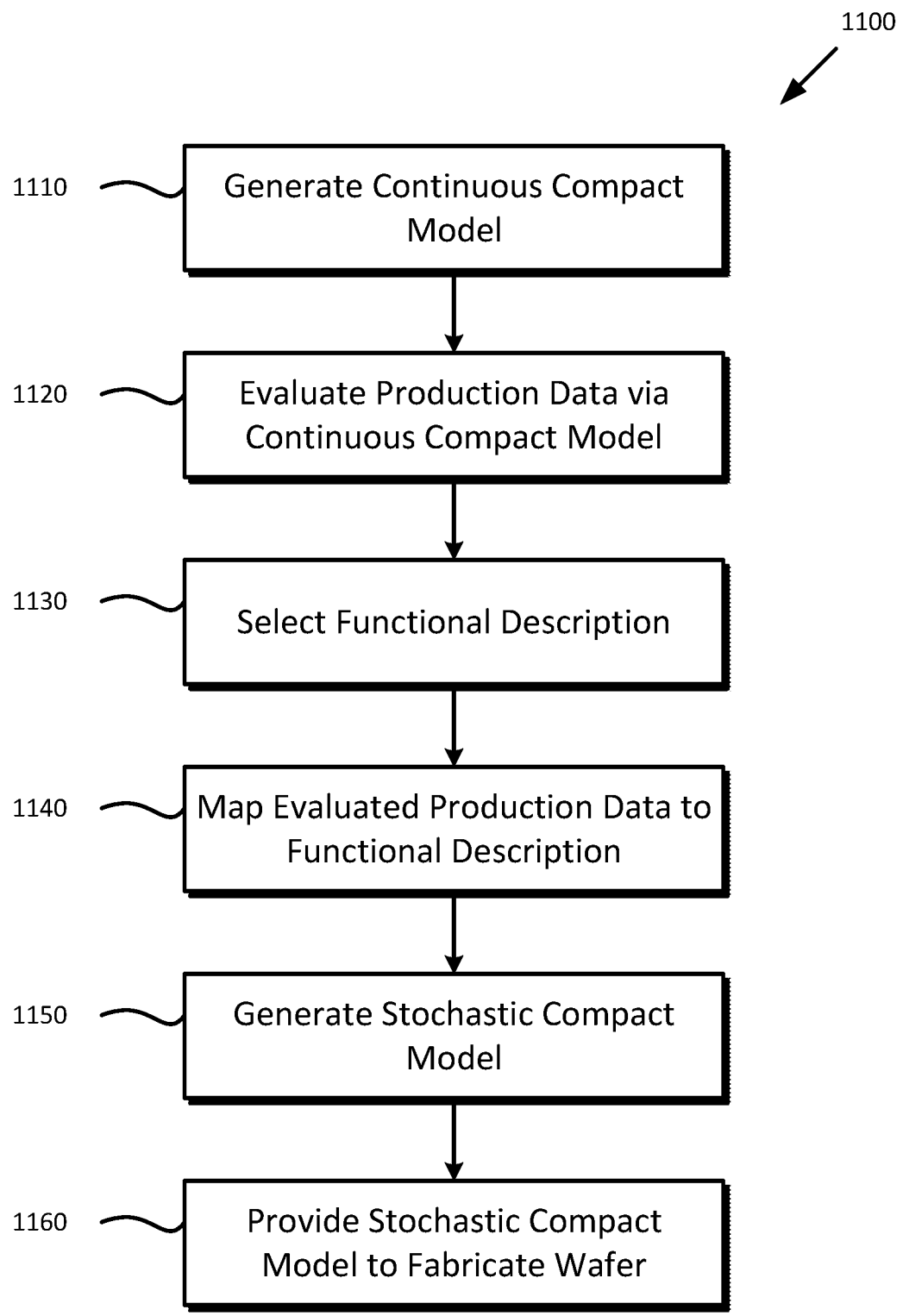
FIG. 11 is a is a flowchart of a method for applying a stochastic compact model, according to embodiments of the present disclosure.

FIG. 11 is a flowchart of a method 1100 for applying a stochastic compact model, according to embodiments of the present disclosure. FIG. 11 provides a restated understanding of the methodology discussed in relation to FIG. 6, and the concepts described in relation to method 600 may be used in combination with the concepts described in relation to method 1100 and vice versa.

Method 1100 begins at 1110 where the modeling device generates a continuous compact model for a mask pattern that is calibrated to production data. A continuous compact model identifies, for several measured locations in the wafer design, a mean value for those locations of the edge of an applied mask pattern has been observed (e.g., by a SEM) over a series of production runs. These production data can include several different locations of the edge for a given mask design using various dopant concentrations, exposure times/intensities, and PEB times/heats which are averaged to identify the mean location for the edge used in the continuous compact model. In various embodiments, the continuous compact model can be based on contours measured via SEM or discrete measurements of the CD at specific locations by a SEM.

For example, the modeling device can measure where the edge location is (on average) located over X production runs at Y different measurement sites in the wafer design to identify a corresponding Y different mean values for the edge location at each corresponding measurement site.

Accordingly, wherein generating the continuous compact model, the modeling devices can measure edge locations for the resist mask pattern at a plurality of measurements sites on several wafers. From these several measurements taken across different production runs, the modeling device determines mean locations for the resist mask pattern at each of the plurality of measurement sites, and maps or fits a represented function to the determined mean values to define a continuous compact model for the edge locations.

At 1120, the modeling device evaluates the production data according to the continuous compact model. In one embodiment, the continuous compact model represents a continuous and smooth function to describe the mean edge locations observed across the different measurement sites in the production data across various specified locations on the wafer design. In various embodiments, the continuous model uses a symmetrical function that attempts to describe variance from the mean locational value using the same functional description for positive and negative variations.

The individual edge locations used to determine mean edge locations can be affected by various parameters, which the modeling device can derive from the production data. For example, the modeling device can derive parameters for: the gradient of the continuous model at various points, a slope (or direction thereof) at a given point, extreme (high or low) values in the dataset (e.g., global maximum/minimum values) or a subset of the dataset (e.g., local maxima/minima values), contrast within a given region between local maxima and minima (e.g., (max−min)/(max+min)), and the like. Additionally or alternatively, the various parameters can include various production parameters including: various dopant concentrations, exposure times/intensities, and PEB times/heats, etc.

At 1130, the modeling device selects a functional description for how to probabilistically represent edge locations as ranges from the mean value to define a stochastic compact model for the mask pattern. The functional description models variations or perturbations from the mean locational value (represented in the continuous compact model) and may be represented as two functions (one for positive variations and one for negative variations from the mean value) or one asymmetric function to account for different behaviors that result in edge location ranges above or below the mean value. In various embodiments, the functional description chosen to model the statistical variation in the mean value uses one or more of the parameters (identified per 1120) as variables to describe the probabilistic location of the edge. Accordingly, the selected function can be a univariate or multivariate function to probabilistically model the edge locations in the stochastic compact model At 1140, the modeling device maps the evaluated production data to the functional description (selected per 1130). In various embodiments, the modeling device selects the same locations in the production data that were used to evaluate the continuous model (per 1120), may use different locations, or a combination of at least one of the same and at least some different locations to use when mapping the production data to the functional description (selected per 1130).

In some embodiments, when mapping the evaluated production data to the stochastic model, the modeling device uses a subset (e.g., some but not all) of the measurement locations used in developing the continuous model. For example, when the modeling device maps the production data from γ different measurement sites to the continuous model, the modeling device an use the production data from less than γ measurement sites. The selected measurement sites can include an interpolated subset of the continuous model measurement sites (e.g., every other one of γ measurement sites), a randomly selected subset of the measurement sites, or some other metric or selection criteria.

In various embodiments, mapping the evaluated production data can include debiasing noise from LER measurements in the stochastic compact model. Noise sources include the SEM as well as from process variations from multiple different production runs, which the modeling device can de-bias using a constant noise value (e.g., an estimated constant noise) or other methodologies.

At 1150, the modeling device generates a stochastic compact model that probabilistically models the edge locations for the resist mask as ranges from the mean based on the production data mapped to the functional descriptions. In various embodiments, the mapped production data are scaled to a designated standard deviation from the production data (e.g., $x\sigma$) to define the location where the edge is located within a desired confidence interval (e.g., 99.7% of the time for $3\sigma$, 99.99% of the time for $4\sigma$, etc.).

At 1160, modeling device provides the stochastic compact model to a production device to fabricate a wafer with the resist mask modeled according to the stochastic compact model. In various embodiments, the production device receives the stochastic compact model from the modeling device, or can operate as a combined modeling and production device. Once received, the production device uses the stochastic compact model to determine whether the wafer as a whole or certain identifiable areas on the wafer can be produced via a single-exposure EUV patterning. Although some non-conformances (e.g., micro-bridges/missing contacts or broken lines/merging contacts due to a misapplied edge of the resist pattern) are expected, and can be part of a conforming wafer if present in small enough numbers, when the expected number of non-conformances exceeds a failure threshold, the production device indicates that the wafer (or identified region thereof) cannot be produced within a given confidence level, and alerts a designer to the expected production failure.

Various features are described in the present disclosure with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed subject matter or as a limitation on the scope of the claimed subject matter. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Also, various terms are used herein as used in the art. For example, "optimization", "optimize", and "optimizing" refer, as used in the art and as understood by a person having ordinary skill in the art, to a mathematical formulation of a problem to select some improvement (if an improvement is available), within the structure of the algorithm implemented, of some identified characteristic, and do not imply an absolute or global optimal (as the term is more colloquially used) improvement of the characteristic. For example, in some situations where optimizing may determine a minimum, the minimum may be a local minima rather than the global minimum.

As described in further detail below, the methods described herein can be embodied by one or more sets of instructions, which may be one or more software modules, stored on a non-transitory computer readable medium. One or more processors of a computer system can be configured to read and execute the one or more sets of instructions, which causes the one or more processors to perform the various operations or steps of the methods. Further details are provided below. In some examples, some operations or steps of the method can be embodied as one or more sets of instructions as one or more software modules, and other operations or steps of the methods can be embodied as one or more other sets of instructions as one or more other software modules. The different software modules can be distributed and stored on different non-transitory computer readable media on different computer systems for execution by respective one or more processors of the different computer systems in some examples.

A person having ordinary skill in the art will readily understand various data structures that may be implemented in the above process. For example, a class of mask objects can be defined for polygons and/or edges of polygons of a mask pattern. Similarly, a database or other storage structure can be implemented to store data of a PLT, Jacobian matrix, and/or CFG. Different data structures and/or modified data structures can be used in different examples.

Additionally, a person having ordinary skill in the art will readily understand various modifications to the logical and/or mathematical expressions of examples described herein. For example, terms such as vector, table, and matrix are generally thought of as mathematical expressions, and related terms, such as column and row, similarly can be organizations within a mathematical expression and can be changed to different organizations. Other examples contemplate such modifications.

Figure 12:
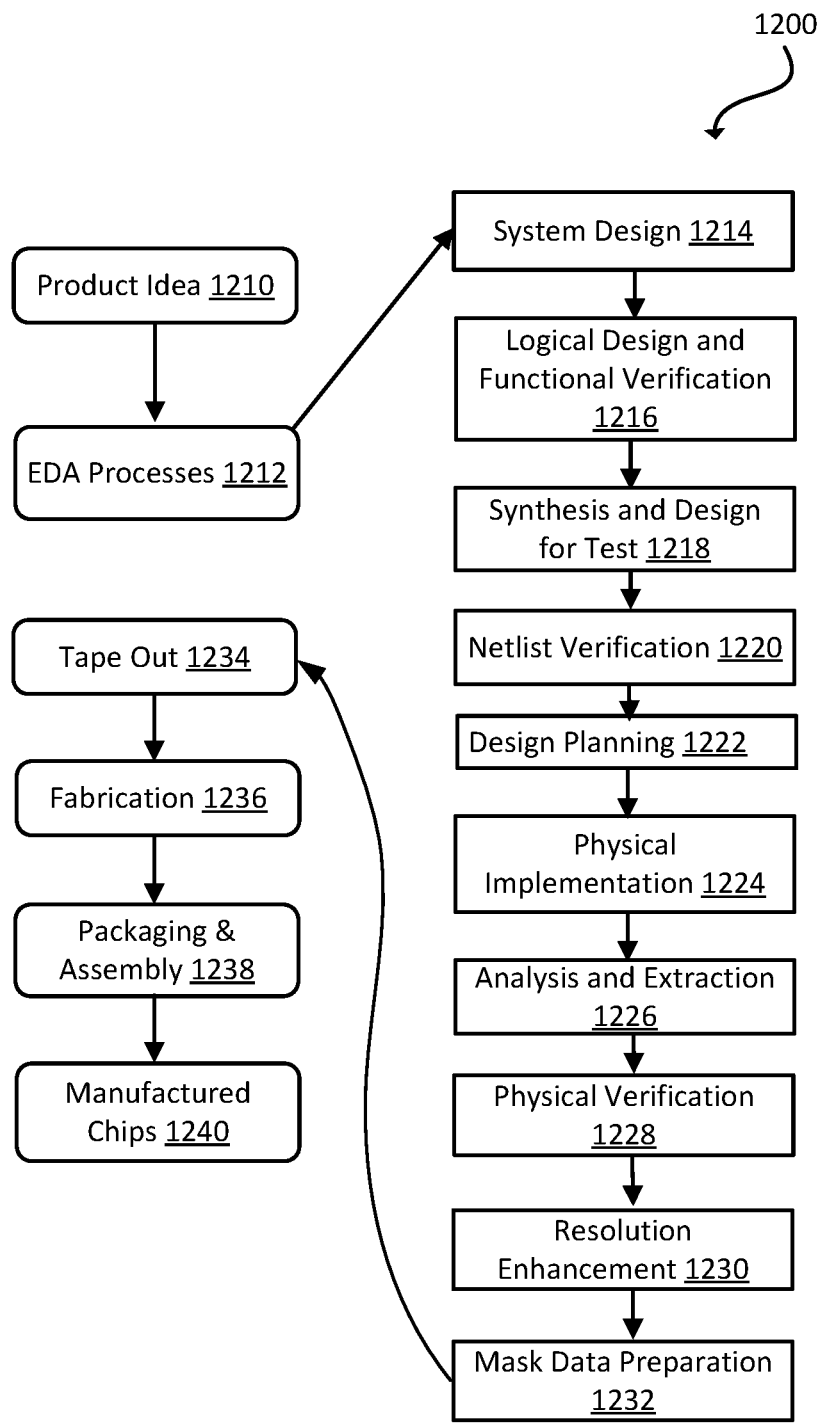
FIG. 12 depicts a flowchart of various processes used during the design and manufacture of an integrated circuit in accordance with some examples of the present disclosure.

FIG. 12 illustrates an example set of processes 1200 used during the design, verification, and fabrication of an integrated circuit on a semiconductor die to transform and verify design data and instructions that represent the integrated circuit. Each of these processes can be structured and enabled as multiple modules or operations. The term "EDA" signifies Electronic Design Automation. These processes start, at 1210, with the creation of a product idea with information supplied by a designer, information that is transformed to create an integrated circuit that uses a set of EDA processes, at 1212. When the design is finalized, the design is taped-out, at 1234, which is when artwork (e.g., geometric patterns) for the integrated circuit is sent to a fabrication facility to manufacture the mask set, which is then used to manufacture the integrated circuit. After tape-out, at 1236, the integrated circuit is fabricated on a semiconductor die, and at 1238, packaging and assembly processes are performed to produce, at 1240, the finished integrated circuit (oftentimes, also referred to as "chip" or "integrated circuit chip").

Specifications for a circuit or electronic structure may range from low-level transistor material layouts to high-level description languages. A high-level of representation may be used to design circuits and systems, using a hardware description language (HDL) such as VHDL, Verilog, SystemVerilog, SystemC, MyHDL or OpenVera. The HDL description can be transformed to a logic-level register transfer level (RTL) description, a gate-level description, a layout-level description, or a mask-level description. Each lower representation level that is a more detailed representative description adds more useful detail into the design description, such as, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 12. The processes described may be enabled by EDA products (or tools).

During system design, at 1214, functionality of an integrated circuit to be manufactured is specified. The design may be optimized for desired characteristics such as power consumption, performance, area (physical and/or lines of code), and reduction of losses, etc. Partitioning of the design into different types of modules or components can occur at this stage.

During logic design and functional verification, at 1216, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some examples, special systems of components, referred to as emulators or prototyping systems, are used to speed up the functional verification.

During synthesis and design for test, at 1218, HDL code is transformed to a netlist. In some examples, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification, at 1220, the netlist is checked for compliance with timing constraints and for correspondence with the HDL code. During design planning, at 1222, an overall floor plan for the integrated circuit is constructed and analyzed for timing and top-level routing.

During layout or physical implementation, at 1224, physical placement (positioning of circuit components, such as transistors or capacitors) and routing (connection of the circuit components by multiple conductors) occurs, and the selection of cells from a library to enable specific logic functions can be performed. As used herein, the term "cell" may specify a set of transistors, other components, and interconnections that provides a Boolean logic function (e.g., AND, OR, NOT, XOR) or a storage function (such as a flip-flop or latch). As used herein, a circuit "block" may refer to two or more cells. Both a cell and a circuit block can be referred to as a module or component and are enabled as both physical structures and in simulations. Parameters are specified for selected cells (based on standard cells) such as size and made accessible in a database for use by EDA products.

During analysis and extraction, at 1226, the circuit function is verified at the layout level, which permits refinement of the layout design. During physical verification, at 1228, the layout design is checked to ensure that manufacturing constraints are correct, such as design rule check (DRC) constraints, electrical constraints, lithographic constraints, and that circuitry function matches the HDL design specification. During resolution enhancement, at 1230, the geometry of the layout is transformed to improve how the circuit design is manufactured.

During tape-out, data is created to be used (after lithographic enhancements are applied if appropriate) for production of lithography masks. During mask data preparation, at 1232, the tape-out data is used to produce lithography masks that are used to produce finished integrated circuits.

A storage subsystem of a computer system (such as computer system 1300 of FIG. 13) may be used to store the programs and data structures that are used by some or all of the EDA products described herein, and products used for development of cells for the library and for physical and logical design that use the library.

Figure 13:
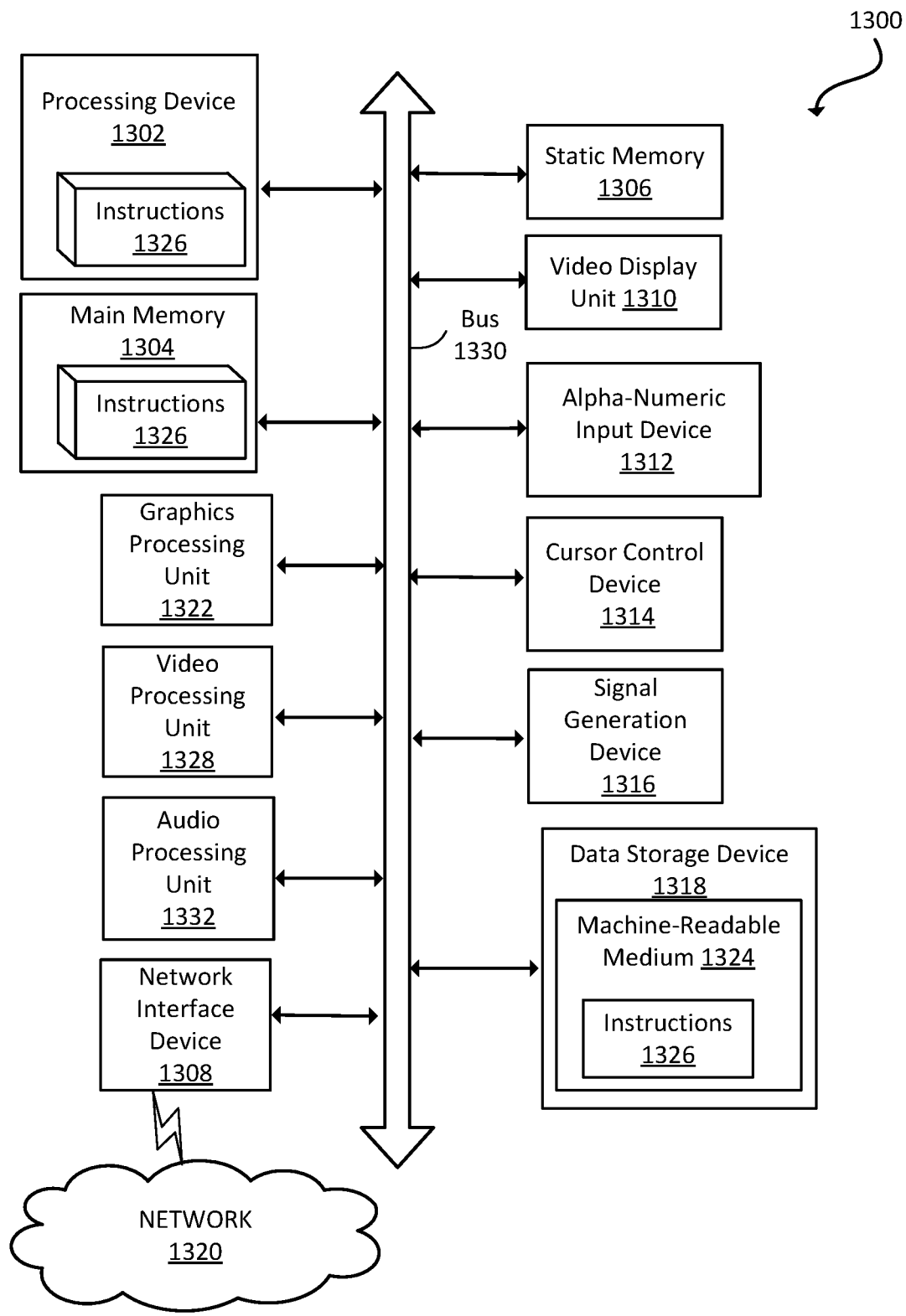
FIG. 13 depicts a representative diagram of an example computer system in which examples of the present disclosure may operate.

FIG. 13 illustrates an example of a computer system 1300 within which a set of instructions, for causing the computer system to perform any one or more of the methodologies discussed herein, may be executed. In some implementations, the computer system may be connected (e.g., networked) to other machines or computer systems in a local area network (LAN), an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that computer system. Further, while a single computer system is illustrated, the term computer system shall also be taken to include any collection of computer systems that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM), a static memory 1306 (e.g., flash memory, static random access memory (SRAM), etc.), and a data storage device 1318, which communicate with each other via a bus 1330. The main memory 1304 includes or is a non-transitory computer readable medium. The main memory 1304 (e.g., a non-transitory computer readable medium) can store one or more sets of instructions 1326, that when executed by the processing device 1302, cause the processing device 1302 to perform some or all of the operations, steps, methods, and processes described herein.

Processing device 1302 represents one or more processors such as a microprocessor, a central processing unit, or the like. More particularly, the processing device 1302 may be or include complex instruction set computing (CISC) microprocessor, reduced instruction set computing (RISC) microprocessor, very long instruction word (VLIW) microprocessor, a processor implementing other instruction sets, or processor(s) implementing a combination of instruction sets. Processing device 1302 may also be one or more special-purpose processing devices such as an application specific integrated circuit (ASIC), a field programmable gate array (FPGA), a digital signal processor (DSP), network processor, or the like. The processing device 1302 may be configured to execute instructions 1326 for performing some or all of the operations, steps, methods, and processes described herein.

The computer system 1300 may further include a network interface device 1308 to communicate over the network 1320. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), a graphics processing unit 1322, a signal generation device 1316 (e.g., a speaker), graphics processing unit 1322, video processing unit 1328, and audio processing unit 1332.

The data storage device 1318 may include a machine-readable storage medium 1324 (e.g., a non-transitory computer-readable medium) on which is stored one or more sets of instructions 1326 or software embodying any one or more of the methodologies or functions described herein. The instructions 1326 may also reside, completely or at least partially, within the main memory 1304 and/or within the processing device 1302 during execution thereof by the computer system 1300, the main memory 1304 and the processing device 1302 also including machine-readable storage media.

In some implementations, the instructions 1326 include instructions to implement functionality described above. While the machine-readable storage medium 1324 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the computer system and that cause the computer system and the processing device 1302 to perform any one or more of the methodologies described above. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory (ROM), random access memory (RAM), magnetic disk storage media, optical storage media, flash memory devices, etc.

In the foregoing disclosure, implementations of the disclosure have been described with reference to specific example implementations thereof. It will be evident that various modifications may be made thereto without departing from the broader scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
    obtaining data of process variations in producing a resist mask;
    calibrating a continuous compact model of the resist mask based on the data;
    evaluating the continuous compact model against a stochastic compact model that is based on the data;
    choosing a functional description of an edge location distribution for the stochastic compact model;
    mapping image parameters from the evaluation to edge distribution parameters according to the functional description;
    determining an edge location range for the stochastic compact model based on scaled measurements from the image parameters;
    calibrating a threshold for the resist mask and updating parameters of the stochastic compact model to reduce a difference between the data and a modeled Line Edge Roughness (LER) value; and
    outputting the stochastic compact model.

2. The method of claim 1, further comprising:
    fabricating a resist mask for a chip according to the stochastic compact model.

3. The method of claim 1, further comprising:
    debiasing noise from LER measurements in the stochastic compact model, wherein the noise is debiased from the LER measurements by:
    removing a constant noise value from the LER measurements based on a noise standard deviation.

4. The method of claim 1, wherein the edge location range indicates an outer bound for a predicted edges location within a desired amount of deviation from a mean location in the data.

5. The method of claim 1, wherein the image parameters are converted to the scaled measurements according to a designated standard deviation from the data.

6. The method of claim 1, wherein the functional description is selected as an asymmetric function that describes deviations above a mean value from the data differently from deviations below the mean value.

7. The method of claim 1, wherein the modeled LER value indicates a stochastic confidence interval from a mean value calculated from the data.

8. A method, comprising:
    generating a continuous compact model for a resist mask pattern calibrated to production data;
    evaluating the production data according to the continuous compact model;
    selecting a functional description to represent an edge location range of the resist mask pattern in a stochastic compact model of the resist mask pattern;
    mapping the evaluated production data to the selected functional description; and generating the stochastic compact model that probabilistically models the edge location ranges for the resist mask pattern based on the mapped production data.

9. The method of claim 8, further comprising:
fabricating a wafer with the resist mask pattern as modeled by the stochastic compact model.

10. The method of claim 8, wherein the mapped production data are scaled to a designated standard deviation from the production data.

11. The method of claim 8, wherein mapping the evaluated production data further comprises debiasing noise from Line Edge Roughness (LER) measurements in the stochastic compact model.

12. The method of claim 8, wherein generating the continuous compact model for the resist mask pattern calibrated to production data further comprises:
measuring edge locations for the resist mask pattern on a plurality of wafers patterned according to the resist mask pattern at a plurality of measurement sites across a plurality of wafers;
determining mean locations for the resist mask pattern at each of the plurality of measurement sites; and
mapping a representative function to the mean locations to predict a continuous mean edge location in the resist mask pattern.

13. The method of claim 8, wherein the functional description is selected as an asymmetric function that describes a range of locations within a given confidence interval from a mean value of edge locations from the production data that represents deviations above the mean value differently from deviations below the mean value.

14. A system, comprising:
a processor; and
a memory including instructions that when executed by the processor are configured to perform an operation comprising:
obtaining data of process variations in producing a resist mask;
calibrating a continuous compact model of the resist mask based on the data;
evaluating the continuous compact model against a stochastic compact model that is based on the data;
choosing a functional description of an edge location distribution for the stochastic compact model;
mapping image parameters from the evaluation to edge distribution parameters according to the functional description;
computing an edge location range for the stochastic compact model based on scaled measurements from the image parameters;
calibrating a threshold for the resist mask and updating parameters of the stochastic compact model to reduce a difference between the data and a modeled Line Edge Roughness (LER) value; and
outputting the stochastic compact model.

15. The system of claim 14, wherein the operation further comprises:
fabricating a resist mask for a chip according to the stochastic compact model.

16. The system of claim 14, further comprising:
debiasing noise from LER measurements in the stochastic compact model, wherein the noise is debiased from the LER measurements by:
removing a constant noise value from the LER measurements based on a noise standard deviation.

17. The system of claim 14, wherein the edge location range indicates an outer bound for predicted edges locations within a desired amount of deviation from a mean location in the data.

18. The system of claim 14, wherein the mapped image parameters are converted to the scaled measurements according to a designated standard deviation from the data.

19. The system of claim 14, wherein the functional description is selected as an asymmetric function that describes deviations above a mean value from the data differently from deviations below the mean value.

20. The system of claim 14, wherein the modeled LER value indicates a stochastic confidence interval from a mean value calculated from the data.

\* \* \* \* \*